(12) United States Patent
Yamada

(10) Patent No.: US 9,755,644 B2
(45) Date of Patent: Sep. 5, 2017

(54) INTERFACE CIRCUIT

(71) Applicant: LAPIS Semiconductor Co., Ltd., Yokohama (JP)

(72) Inventor: Takashi Yamada, Yokohama (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 0 days.

(21) Appl. No.: 15/279,574

(22) Filed: Sep. 29, 2016

(65) Prior Publication Data

US 2017/0093402 A1 Mar. 30, 2017

(30) Foreign Application Priority Data

Sep. 30, 2015 (JP) ................................. 2015-192956
Jul. 6, 2016 (JP) ................................. 2016-134254

(51) Int. Cl.
*H03K 19/0185* (2006.01)
*H03K 19/20* (2006.01)

(52) U.S. Cl.
CPC ..... *H03K 19/018521* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 4,695,744 A | * | 9/1987 | Giordano | H03K 3/356104 327/210 |
| 4,954,729 A | * | 9/1990 | Urai | H03K 19/0013 326/121 |
| 4,961,010 A | * | 10/1990 | Davis | H03K 19/00361 326/103 |
| 4,983,861 A | * | 1/1991 | Kikuchi | G11C 7/1078 326/14 |
| 5,001,369 A | * | 3/1991 | Lee | H03K 19/09429 326/27 |
| 5,027,009 A | * | 6/1991 | Urakawa | H03K 19/09448 326/110 |
| 5,077,492 A | * | 12/1991 | Fuse | H01L 27/0623 257/E27.015 |
| 5,124,579 A | * | 6/1992 | Naghshineh | H03K 19/00361 326/27 |

(Continued)

FOREIGN PATENT DOCUMENTS

| | | |
|---|---|---|
| JP | H04-47597 A | 2/1992 |
| JP | 2003-092359 A | 3/2003 |

*Primary Examiner* — Crystal L Hammond
(74) *Attorney, Agent, or Firm* — Rabin & Berdo, P.C.

(57) ABSTRACT

An interface circuit includes at least one semiconductor logic gate and a latch circuit. The semiconductor logic gate configured to receive an input signal having a signal level changeable and outputs a logic gate signal which has a signal level becoming a low level when a signal level of the input signal is not less than a logic threshold value, alternatively has a signal level becoming a high level when a signal level of the input signal is less than the logic threshold value. The latch circuit fetches the logic gate signal as a first latch signal, while fetching a signal which is converted from the input signal and has a signal level varying between a second voltage and the ground potential, alternatively, the input signal as a second latch signal, to output the first interface output signal and the second interface output signal.

16 Claims, 19 Drawing Sheets

(56) References Cited

U.S. PATENT DOCUMENTS

| | | | | |
|---|---|---|---|---|
| 5,166,558 A * | 11/1992 | Ohsawa | H03K 19/018521 | 326/34 |
| 5,369,315 A * | 11/1994 | Tran | H03K 19/01728 | 326/21 |
| 5,399,915 A * | 3/1995 | Yahata | G09G 3/30 | 327/108 |
| 5,633,599 A * | 5/1997 | Kubota | G01R 31/3004 | 326/16 |
| 5,723,992 A * | 3/1998 | Yin | H03K 19/00315 | 326/83 |
| 5,854,560 A * | 12/1998 | Chow | H03K 19/00361 | 326/27 |
| 5,856,750 A * | 1/1999 | Koseki | H03K 5/082 | 327/206 |
| 5,864,244 A * | 1/1999 | Kaplinsky | H03K 19/09429 | 326/27 |
| 5,883,538 A * | 3/1999 | Keeth | G11C 8/08 | 326/81 |
| 6,020,762 A * | 2/2000 | Wilford | H03K 19/0016 | 326/57 |
| 6,094,067 A * | 7/2000 | Taniguchi | H03K 19/0013 | 326/58 |
| 6,166,969 A * | 12/2000 | Song | H03K 19/018521 | 327/333 |
| 6,262,599 B1 * | 7/2001 | Coughlin, Jr. | H03K 19/09429 | 326/68 |
| 6,278,294 B1 * | 8/2001 | Taniguchi | H03K 19/0013 | 326/57 |
| 6,304,495 B1 * | 10/2001 | Kim | G11C 7/1006 | 365/189.08 |
| 6,483,340 B2 * | 11/2002 | Uenishi | H03K 19/018585 | 326/113 |
| 6,570,414 B1 * | 5/2003 | Eker | H03K 19/0013 | 326/83 |
| 7,208,984 B1 * | 4/2007 | Petrofsky | H03K 3/012 | 326/82 |
| 8,405,424 B2 * | 3/2013 | Bennett | H03K 19/018571 | 326/27 |
| 9,471,120 B1 * | 10/2016 | Thakur | G06F 1/26 | |
| 9,509,300 B2 * | 11/2016 | Teplechuk | H03K 5/1252 | |
| 2002/0009013 A1 * | 1/2002 | Lee | G11O 5/14 | 365/230.06 |
| 2002/0050849 A1 * | 5/2002 | Hayashi | H03K 19/00323 | 327/333 |
| 2003/0080774 A1 * | 5/2003 | Funaba | H03K 19/018592 | 326/30 |
| 2009/0045844 A1 * | 2/2009 | Noh | H03K 19/018528 | 326/81 |
| 2009/0195270 A1 * | 8/2009 | Lin | G11C 7/02 | 326/82 |
| 2011/0298493 A1 * | 12/2011 | Kurita | H03K 19/018521 | 326/63 |
| 2014/0159773 A1 * | 6/2014 | Shin | H03K 19/0016 | 326/80 |

* cited by examiner

FIG. 2

| INPUT | | OUTPUT | |
|---|---|---|---|
| S2 | S3 | OUTA | OUTB |
| L | L | — | — |
| L | H | H | L |
| H | L | L | H |
| H | H | HOLD STATE | |

FIG. 11

| INPUT | | OUTPUT | |
|---|---|---|---|
| IN | LS | OUTA | OUTB |
| L | L | HOLD STATE | |
| L | H | L | H |
| H | L | H | L |
| H | H | — | |

INTERFACE CIRCUIT

BACKGROUND OF THE INVENTION

1. Field of the Invention

The present invention relates to an interface circuit.

2. Description of the Related Art

In a semiconductor device, the interface circuit is used for a circuit for transmitting between a plurality of circuit blocks which have different operating voltages. Particularly, an interface circuit used for an input buffer changes a signal level of an input signal supplied from the outside so as to convert from a voltage level of an external power supply to a voltage level of an internal power supply and supply the convert signal to an internal circuit. Such an interface circuit comprises a plurality of inverter circuits connected to each other in series, for example. In the interface circuit, a first stage inverter circuit inverts the input signal on the basis of the external power supply voltage supplied from the external power supply and the following stage inverter circuits perform the conversion and inversion of the signal level on the basis of the internal power supply.

The internal power supply voltage is generated by descending the voltage level of the external power supply voltage with a voltage convert circuit or the like, for example. Therefore, the voltage level of the voltage level of the internal power supply voltage is lower than the voltage level of the external power supply voltage generally. However, just after the external power supply is dropped or when power failure occurs and so on, there can be situation that the external power supply voltage level becomes less than the internal power supply voltage level, because a time difference (time lag) is produced between these voltage level declines of the external and internal power supply voltages. Particularly, in the foregoing voltage convert circuit, a bypass capacitor may be provided between the voltage convert circuit and the internal circuit in parallel in order to prevent transient potential fluctuation of the external power supply voltage from propagating. Even in such a configuration, the change of the internal power supply voltage does not come up the change of the external power supply voltage. Therefore the potential of the external power supply voltage is apt to become transitionally less than the potential of the internal power supply voltage.

Furthermore, the voltage levels of the external power supply voltage and the internal power supply voltage have fluctuation even by influence of noise or the like. There is developed a semiconductor device having a circuit breaker breaking between the interface circuit and the internal circuit in order to avoid the voltage level fluctuation of the supply voltage affecting the interface circuit operation (for example, Japanese Patent Application Laid-Open No. H4-47597, referring to as "patent document 1" hereinafter). Furthermore, there is also developed an interblock interface circuit for performing a signal exchange between a plurality of circuit blocks, which includes a storage unit maintaining an output signal from one of circuit blocks, and an interblock signal control circuit which, when breaking the power supply to the circuit blocks, breaks signal transition between the circuit blocks storage and the storage unit and then continues to output the stored signal (for example, Japanese Patent Application Laid-Open No. 2003-92359, referring to as "patent document 2" hereinafter).

The situation occurs in that the external power supply voltage level becomes less than the internal power supply voltage level, just after the external power supply is dropped or when power failure occurs and so on. After that such voltage level may further decreases less than a logic threshold value of an inverter circuit included in the interface circuit. In such a case, the inverter circuit may make a misjudgment such that, in fact, the signal level of the input signal is a high level, but the circuit decides that it is a low level. Thus, there is a possibility that the malfunction of the interface circuit It can be considered that a circuit such as the circuit breaker or the interblock signal control circuit shown in the foregoing patent documents 1 and 2 is added to the interface circuit in order to prevent the malfunction affecting the internal circuit. However, these circuits have a large circuit scale and large electric power consumption as a problem.

SUMMARY OF THE INVENTION

To solve the foregoing problem, it is an object of the present invention to provide an interface circuit capable of preventing the malfunction due to the voltage fluctuation while suppressing the circuit scale and electric power consumption.

An interface circuit according to the present invention is an interface circuit configured to receive a first voltage and a second voltage and generate an interface output signal based on an input signal, the interface circuit comprising:

a first semiconductor logic gate which receives said first voltage and outputs a first output signal of low level when a signal level of said input signal is not less than a logic threshold value, alternatively outputs said first output signal of high level in response to said first voltage when a signal level of said input signal is less than said logic threshold value;

a second semiconductor logic gate which receives said second voltage and outputs a second output signal of low level when a signal level of said input signal is not less than a logic threshold value, alternatively outputs said second output signal of high level in response to said second voltage when a signal level of said input signal is less than said logic threshold value;

a third semiconductor logic gate which receives said second voltage and outputs a third output signal of low level when a signal level of said first output signal is not less than a logic threshold value, alternatively outputs said third output signal of high level in response to said second voltage when a signal level of said first output signal is less than said logic threshold value; and a latch circuit which receives said second output signal and said third output signal and generates a 4th output signal and a 5th output signal to output said 4th output signal or said 5th output signal as said interface output signal, wherein said latch circuit generates said 4th output signal having an inversed signal level from said second output signal and said 5th output signal having an inversed signal level from said third output signal in a first state in which one of said second output signal and said third output signal is a low level, when, after said first state, both said second output signal and said third output signal transit to a second state of high level, said latch circuit generates said 4th output signal and said 5th output signal holding the respective signal levels of said first state just before transition to said second state.

Furthermore, an interface circuit according to the present invention is an interface circuit configured to receive a first voltage and a second voltage and generate an interface output signal based on an input signal, the interface circuit comprising:

a first semiconductor logic gate which receives said first voltage and outputs a first output signal in response to said input signal;

a second semiconductor logic gate which receives said second voltage and outputs a second output signal in response to said input signal;

a third semiconductor logic gate which receives said second voltage and outputs a third output signal in response to said first output signal; and a latch circuit which receives said second output signal and said third output signal being input and generates said interface output signal, wherein said latch circuit outputs an output value, as said interface output signal, reflecting said second output signal and said third output signal when said second output signal and said third output signal being input have logic values different from each other, when both logic values of said second output signal and said third output signal being input are the same, said latch circuit maintains said output value just before both the logic values become the same and outputs said output value as said interface output signal.

Furthermore, an interface circuit according to the present invention is an interface circuit comprising:

a semiconductor logic gate configured to receive an input signal having a signal level changeable between a first voltage and a ground potential and outputs a logic gate signal which has a signal level becoming a low level when a signal level of said input signal is not less than a logic threshold value, alternatively has a signal level becoming a high level when a signal level of said input signal is less than said logic threshold value; and a latch circuit which fetches said logic gate signal as a first latch signal, while fetching a signal which is converted from said input signal and has a signal level varying between a second voltage and the ground potential, alternatively, said input signal as a second latch signal, to output the first interface output signal and the second interface output signal, wherein said latch circuit outputs a signal having an inversed signal level from the signal level of said first latch signal as said first interface output signal and outputs a signal having an inversed signal level from the signal level of said second latch signal as said second interface output signal in a first state in which only one of said first latch signal and second latch signal is a low level, when both said first latch signal and said second latch signal transit from said first state to a second state in which both said first latch signal and said second latch signal are in a high level or in a low level, said latch circuit outputs at least one of said first interface output signal and said second interface output signal holding the respective signal levels of said first state just before transition from said second state to said second state.

Furthermore, an interface circuit according to the present invention is an interface circuit configured to include a latch circuit to which the input signal and said first voltage are supplied, the input signal having a signal level changeable between the first voltage and a ground potential, to output the output signal, said latch circuit outputs, said output signal, a signal whose a signal level varying with an opposite phase to said input signal IN a first state in which the voltage level of said first voltage is higher than the logic threshold value, when the voltage level of said first voltage transit from said first state to a second state in which the voltage level of said first voltage is less than said logic threshold value, said latch circuit outputs holding the signal level in said first state just before transition to said second state. 16. The interface circuit according to claim 15, wherein said latch circuit includes a first NOR circuit and a second NOR circuit.

According to the present invention, it is possible to prevent a malfunction caused by the voltage fluctuation while reducing the circuit scale and consumed electric power.

BRIEF DESCRIPTION OF THE DRAWINGS

Some aspects and other features of the present invention are explained in the following description, taken in connection with the accompanying drawing figures wherein:

FIG. 2 is a truth table showing the operation of a latch circuit;

FIG. 11 is a truth table showing the operation of a latch circuit of Embodiment 2;

DETAILED DESCRIPTION OF THE INVENTION

Figure 1:
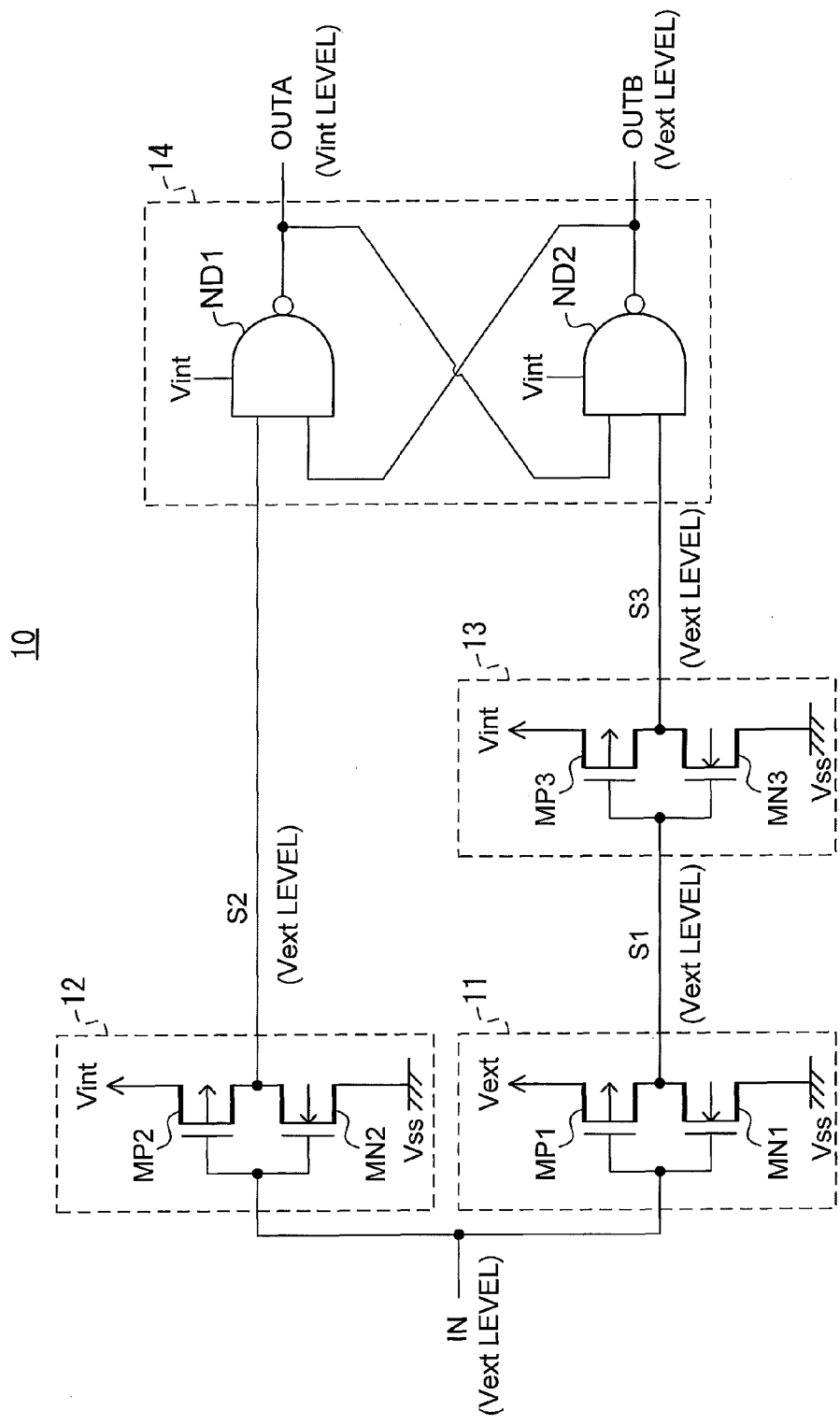
FIG. 1 is a block diagram showing a schematic configuration of an interface circuit according to the present invention.

Hereinafter, embodiments of the present invention will be described in detail with reference to the drawings. In addition, substantially the same or equivalent parts will be denoted by the same reference numerals in the following description and accompanying drawings.

Embodiment 1

FIG. 1 is a block diagram showing a schematic configuration of an interface circuit 10 according to the present invention. The interface circuit 10 receives an input signal IN to generate output signals OUTA and OUTB on the basis of an external power supply voltage Vext supplied from an external power supply (not shown) and an internal power supply voltage Vint generated by converted (descended in voltage) from the external power supply voltage Vext by a voltage converter or the like, so that the output signals OUTA and OUTB are supplied as the interface output signal to a subsequent stage circuit (not shown). Further, the internal power supply voltage Vint is a voltage generated by descending the external power supply voltage Vext and is smaller than the external power supply voltage Vext (Vext>Vint>½Vext, for example) in the normal operation state of the interface circuit 10.

The input signal IN is a rectangular wave signal having a ground potential in the low level and a signal level in the high level, in which the signal level corresponds to the external power supply voltage Vext (the first voltage). Each of the output signals OUTA and OUTB is a rectangular wave signal having the ground potential in the low level and a signal level in the high level, the signal level corresponding to the internal power supply voltage Vint (the second voltage).

The interface circuit 10 includes a first inverter 11, a second inverter 12, a third inverter 13 and a latch circuit 14.

The first inverter 11 is configured to have a p-channel type (first conductivity type) MOS (Metal-Oxide-Semiconductor) transistor MP1 and a n-channel type (second conductivity type) MOS transistor MN1 (hereinafter, the p-channel type MOS transistor is also called "PMOS transistor", and the n-channel type MOS transistor is also called "the NMOS transistor") so as to work in a complementary manner. The drain terminal of the PMOS transistor MP1 is connected to the drain terminal of the NMOS transistor MN1. The external power supply voltage Vext is applied to the source terminal of the PMOS transistor MP1. The source terminal of the NMOS transistor MN1 is grounded and the ground potential Vss is applied thereto. The PMOS transistor MP1 and the NMOS transistor MN1 are high breakdown voltage transistors.

The first inverter 11 is a semiconductor logic gate having the logic threshold value TH1. The logic threshold value TH1 has a value of ½ times of the supply voltage applied to the first inverter 11, namely a value of ½ times of the voltage level of the external power supply voltage Vext. The first inverter 11 receives the input signal IN and outputs a first output signal S1 of low level when a signal level of the input signal IN is not less than a logic threshold value TH1, alternatively outputs the first output signal S1 of high level when a signal level of the input signal IN is less than the logic threshold value TH1. The first inverter 11 is operated by applying the external power supply voltage Vext and the ground potential Vss thereto, as mentioned above. Thus, the first output signal S1 becomes a rectangular wave having a potential in response to the first voltage in the high level and having the ground potential in the low level.

The second inverter 12 is configured to have a PMOS transistor MP2 and an NMOS transistor MN2 which work in a complementary manner. The drain terminal of the PMOS transistor MP2 is connected to the drain terminal of the NMOS transistor MN2. The source terminal of the PMOS transistor MP2 is applied with the internal power supply voltage Vint. The source terminal of the NMOS transistor MN2 is grounded, and is applied with the ground potential Vss. The PMOS transistor MP2 and the NMOS transistor MN2 are composed of high breakdown voltage transistors.

The second inverter 12 is a semiconductor logic gate having the logic threshold value TH2. The logic threshold value TH2 has a value of ½ times of the supply voltage applied to the second inverter 12, namely a value of ½ times of the voltage level of the internal power supply voltage Vint. The second inverter 12 receives the input signal IN and outputs a second output signal S2 of low level when a signal level of the input signal IN is not less than a logic threshold value TH2, alternatively outputs the second output signal S2 of high level when a signal level of the input signal IN is less than the logic threshold value TH2. The second inverter 12 is operated by applying the internal power supply voltage Vint and the ground potential Vss thereto, as mentioned above. Thus, the second output signal S2 becomes a rectangular wave having a potential in response to the second voltage in the high level and having the ground potential in the low level.

The third inverter 13 is configured to have a PMOS transistor MP3 and an NMOS transistor MN3 which work in a complementary manner. The drain terminal of the PMOS transistor MP3 is connected to the drain terminal of the NMOS transistor MN3. The source terminal of the PMOS transistor MP3 is applied with the internal power supply voltage Vint. The source terminal of the NMOS transistor MN3 is grounded, and is applied with the ground potential Vss. The PMOS transistor MP3 and the NMOS transistor MN3 are composed of high breakdown voltage transistors.

The third inverter 13 is a semiconductor logic gate having the logic threshold value TH3. The logic threshold value TH3 has a value of ½ times of the supply voltage applied to the third inverter 13, namely a value of ½ times of the voltage level of the internal power supply voltage Vint. The third inverter 13 receives the first output signal S1 and outputs the first output signal S1 of low level when third output signal S3 is not less than a logic threshold value TH3, alternatively outputs the third output signal S3 of high level when a signal level of the input signal IN is less than the logic threshold value TH2.

The third inverter 13 is operated by applying the internal power supply voltage Vint and the ground potential Vss thereto, as mentioned above. Thus, the third output signal S3 becomes a rectangular wave having a potential in response to the second voltage in the high level and having the ground potential in the low level. In other words, the third output signal S3 becomes a signal which is converted from the input signal IN and has a signal level varying between the second voltage and the ground potential.

The latch circuit 14 is composed of a NAND gate ND1 and a NAND gate ND2. One input terminal of the NAND gate ND1 is connected to the PMOS transistor MP2 of the second inverter 12 and a connection end of the NMOS transistor MN2. The other input terminal of the NAND gate ND1 is connected to the output terminal of the NAND gate ND2. The input terminal of the NAND gate ND2 is connected to the output terminal of the NAND gate ND1. The other input terminal of the NAND gate ND2 is connected to the PMOS transistor MP3 of the third inverter 13 and a connection end of the NMOS transistor MN3. The NAND gate ND1 and the NAND gate ND2 are applied with the internal power supply voltage Vint. The NAND gate ND1 and the NAND gate ND2 are composed of four low breakdown voltage transistors for example.

The latch circuit 14 receives the second output signal S2 and the third output signal S3, and generates the output signals OUTA and OUTB. In other words, the latch circuit 14 fetches the second output signal S2 as the first latch signal while fetching the third output signal S3 as the second latch signal, and outputs the output signals OUTA and OUTB as the first interface output signal and the second interface output signal respectively. FIG. 2 is a truth table showing a relationship of the signal levels of the second output signal S2 and the third output signal S3 to the signal levels of the output signals OUTA and OUTB.

The latch circuit 14 generates the output signal OUTA of high level and the output signal OUTB of low level, and outputs them as the interface output signal when the second output signal S2 is a low level ("L" shown in the Figure) and the third output signal S3 is a high level ("H" shown in the Figure). Furthermore, the latch circuit 14 generates the output signal OUTA of low level and the output signal OUTB of high level, and outputs them as the interface output signal when the second output signal S2 is a high level the third output signal S3 is a low level. In other words, the latch circuit 14 generates the output signal OUTA having an inversed signal level from the second output signal S2 and the output signal OUTB having an inversed signal level from the third output signal S3 in a condition (the first state) in which one of the second output signal S2 and the third output signal S3 is a low level, and then outputs them as the interface output signal.

Furthermore, after the first state, when both the second output signal S2 and the third output signal S3 become high levels (the second state) the latch circuit 14 maintains the signal levels (the first state) of the output signals OUTA and OUTB just before transition to the second state, and outputs the output signals OUTA and OUTB having such signal levels as the interface output signals.

Next, operation of the interface circuit 10 of the present invention will be described with reference to FIG. 3-FIG. 7.

Figure 3:
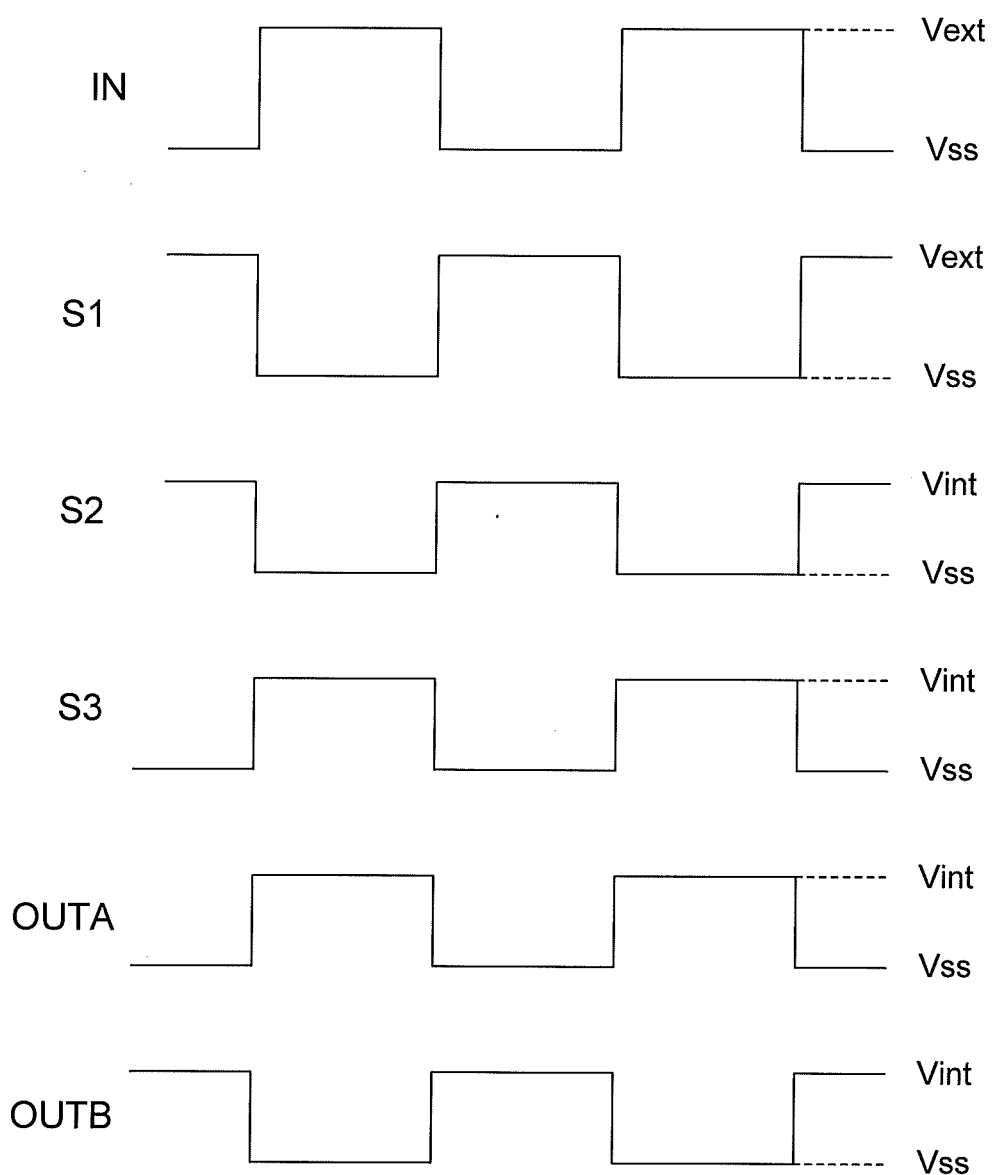
FIG. 3 is a time chart showing signal waveform examples of respective signals in a normal operation.

FIG. 3 is a time chart showing signal waveforms of the input signal IN, the first output signal S1, the second output signal S2, the third output signal S3, the output signals OUTA and OUTB in the normal operation state of the interface circuit 10. Further, as mentioned above, the internal power supply voltage Vint is smaller than the external power supply voltage Vext in the normal operation state, since the internal power supply voltage Vint is generated so that the external power supply voltage Vext is descended by the voltage converter or the like.

The input signal IN is a rectangular wave signal having a ground potential in the low level and a signal level in the high level, the signal level corresponding to the external power supply voltage Vext (the first voltage). The first output signal S1 becomes a rectangular wave having an inversed signal level from the input signal IN. In other words, the input signal IN and the first output signal S1 are complementary and become a high level or low level.

The second output signal S2 becomes a rectangular wave having a signal waveform in that the signal level in a high level of the input signal IN is changed and reversed into the voltage level of the internal power supply voltage Vint (the second voltage). In other words, the third output signal S3 becomes a signal having the same logic as the input signal IN (having a high level when the input signal IN is a high level, or a low level when the input signal IN is a low level). Furthermore, the second output signal S2 becomes a signal having the inverse logic to the input signal IN (having a low level when the input signal IN is a high level, or a high level when the input signal IN is a low level).

The output signals OUTA and OUTB become signal waveforms having the signal value according to the truth table shown in FIG. 2. In other words, when the second output signal S2 is a low level and the third output signal S3 is a high level, the output signal OUTA is a high level and the output signal OUTB is a low level. When the second output signal S2 is a high level and the third output signal S3 is a low level, the output signal OUTA is a low level and the output signal OUTB is a high level. Thus, the same logic as the input signal IN (having a high level when the input signal IN is a high level, or a low level when the input signal IN is a low level) is generated as the output signal OUTA. Furthermore, the inverse logic to the input signal IN (having a low level when the input signal IN is a high level, or a high level when the input signal IN is a low level) is generated as the output signal OUTB.

Next, the operation of the interface circuit 10 in a situation that logic threshold values TH1-TH3 of the respective inverters (hereinafter, these are also called "logic threshold value TH" collectively) drop caused by decrease of the voltage levels of the external power supply voltage Vext will be described. As mentioned above, the external power supply voltage Vext is larger than the internal power supply voltage Vint in the normal operation state. In case that the external power supply is shutdown or halted by a power failure or the like during the device operation, a time difference between the potential drops of the external power supply voltage Vext and the internal power supply voltage Vin occurs, thereby the potential of the external power supply voltage Vext becomes inferior to the potential of the internal power supply voltage Vin, and further to that of the logic threshold value TH. Further, in such case, the voltage level of the external power supply voltage Vext gradually decrease practically, resulting in becoming less than the logic threshold value TH. In the following description, for convenience of explanation, there is described in case that voltage level of the external power supply voltage Vext becomes less than the logic threshold value TH by switching at a certain time point, regarding the changes of signal waveforms of respective signals.

Figure 4:
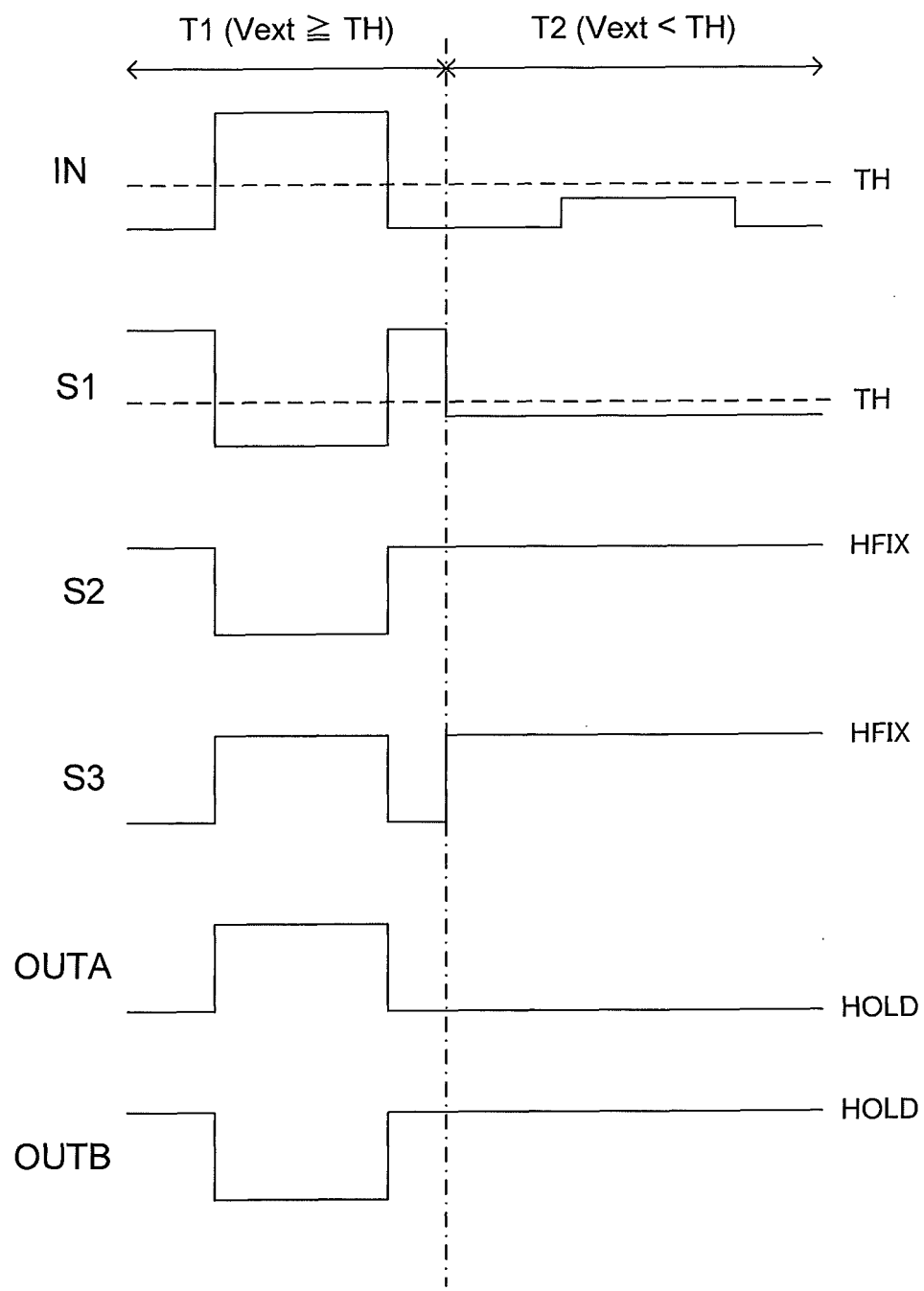
FIG. 4 is a time chart showing a signal waveform example of voltage levels when an external power supply voltage decrease less than the logic threshold value of an inverter in a period of time an input signal is in a low level.
Figure 5:
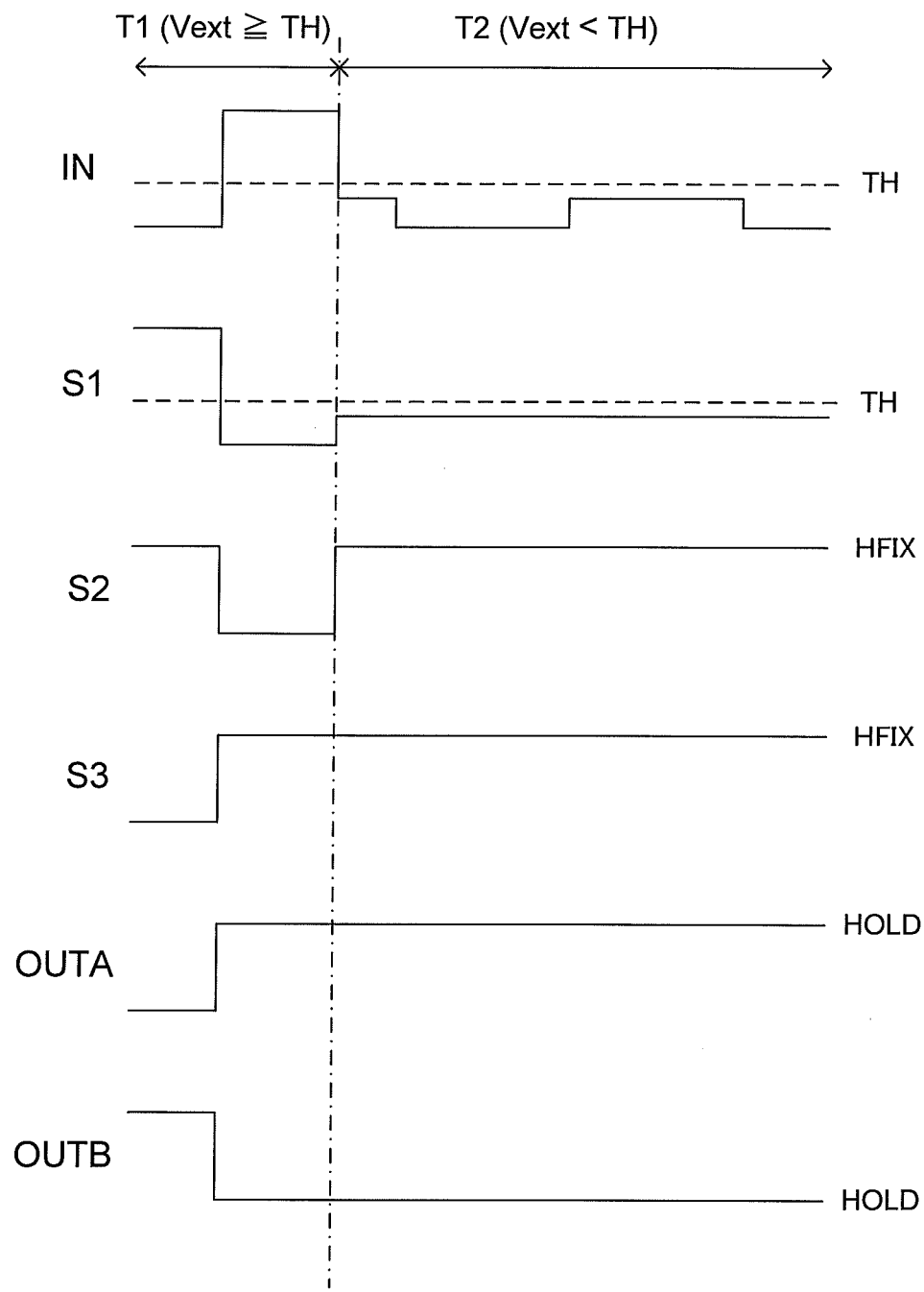
FIG. 5 is a time chart showing a signal waveform example of voltage levels when an external power supply voltage decrease less than the logic threshold value of an inverter in a period of time an input signal is in a high level.

FIG. 4 is a time chart showing signal waveform examples of voltage levels when the voltage level of the external power supply voltage Vext is decreased less than the logic threshold value TH in a timing of the input signal IN of low level. Further FIG. 5 is a time chart showing signal waveform examples of voltage levels when the voltage level of the external power supply voltage Vext is decreased less than the logic threshold value TH in a timing of the input signal IN of high level. In these Figures, Section T1 (The left side part than the dashed line) shows a portion in that the external power supply voltage Vext is not less than the logic threshold value TH. Section T2 (The right side part than the dashed line) shows a portion in that the external power supply voltage Vext is less than the logic threshold value TH.

In Section T1, the signal waveforms of the input signal IN, the first output signal S1, the second output signal S2, the third output signal S3 and the output signals OUTA and OUTB are similar to those signal waveforms in the normal operation state as shown in FIG. 3, since the voltage level of the external power supply voltage Vext is not less than the logic threshold value TH.

In Section T2, when the voltage level of the external power supply voltage Vext is less than the logic threshold value TH, the signal level of the input signal IN is less than the logic threshold value TH even in the high level state. The inverter 11 decides that the input signal IN of high level is supplied if supplied with the input signal IN not less than the logic threshold value TH1. The inverter 11 decides that the input signal IN of low level is supplied if supplied with the input signal IN less than the logic threshold value TH1. Therefore, in Section T2, since the signal level of the input signal IN is less than the logic threshold value TH (i.e. less than the logic threshold value TH1), the inverter 11 decides that the input signal IN of high level is supplied.

The inverter 11 outputs the first output signal S1 of high level, when the input signal IN is a low level. Therefore, the first output signal S1 is a high level in Section T2. Of course, the signal level of the first output signal S1 in the high level state is equal to the voltage level of the external power supply voltage Vext. Therefore, the signal level of the first output signal S1 is less than the logic threshold value TH in Section T2.

The inverter 12 decides that the input signal IN of high level is supplied if supplied with the input signal IN not less than the logic threshold value TH2. The inverter 12 decides that the input signal IN of low level is supplied if supplied with the input signal IN less than the logic threshold value TH2. As mentioned above, in Section T2, since the signal level of the input signal IN is less than the logic threshold value TH (i.e. less than the logic threshold value TH2), the inverter 12 decides that the input signal IN of high level is supplied.

The inverter 12 outputs the second output signal S2 of high level when input with the input signal IN of low level. Therefore, the signal level of the second output signal S2 is fixed in a high level in Section T2. Further, the signal level of the second output signal S2 in the high level state is equal to the voltage level of the internal power supply voltage Vint.

The inverter 13 decides that the first output signal S1 of high level is supplied if supplied with the first output signal S1 not less than the logic threshold value TH3. The inverter 13 decides that the first output signal S1 of low level is supplied if supplied with the first output signal S1 less than the logic threshold value TH3. As mentioned above, in Section T2, since the signal level of the first output signal S1 is less than the logic threshold value TH (i.e. less than the logic threshold value TH3), the inverter 13 decides that the first output signal S1 of high level is supplied.

The inverter 13 outputs the third output signal S3 of high level when input with the first output signal S1 of low level. Therefore, the signal level of the third output signal S3 is fixed in a high level in Section T2. Further, the signal level of the third output signal S3 in the high level state is equal to the voltage level of the internal power supply voltage Vint.

As mentioned above, both the second output signal S2 and the third output signal S3 are fixed at a high level in Section T2. As mentioned above, when both the second output signal S2 and the third output signal S3 become high levels (the second state), the latch circuit 14 maintains the signal levels (the first state) of the output signals OUTA and OUTB just before transition to the second state, and outputs the output signals OUTA and OUTB having such signal levels as the interface output signal.

In FIG. 4, since the output signal OUTA just before transition from Section T1 to Section T2 is in a low level, the latch circuit 14 maintains such a signal level in Section T2, and continues to output the output signal OUTA of low level as the interface output signal. Furthermore, since the output signal OUTB just before transition from Section T1 to Section T2 is in a high level, the latch circuit 14 maintains such a signal level in Section T2, and continues to output the output signal OUTA of high level as the interface output signal.

Whereas, in FIG. 5, since the output signal OUTA just before transition from Section T1 to Section T2 is in a high level, the latch circuit 14 maintains such a signal level in Section T2, and continues to output the output signal OUTA of high level as the interface output signal. Furthermore, since the output signal OUTB just before transition from Section T1 to Section T2 is in a low level, the latch circuit 14 maintains such a signal level in Section T2, and continues to output the output signal OUTA of low level as the interface output signal.

Figure 6:
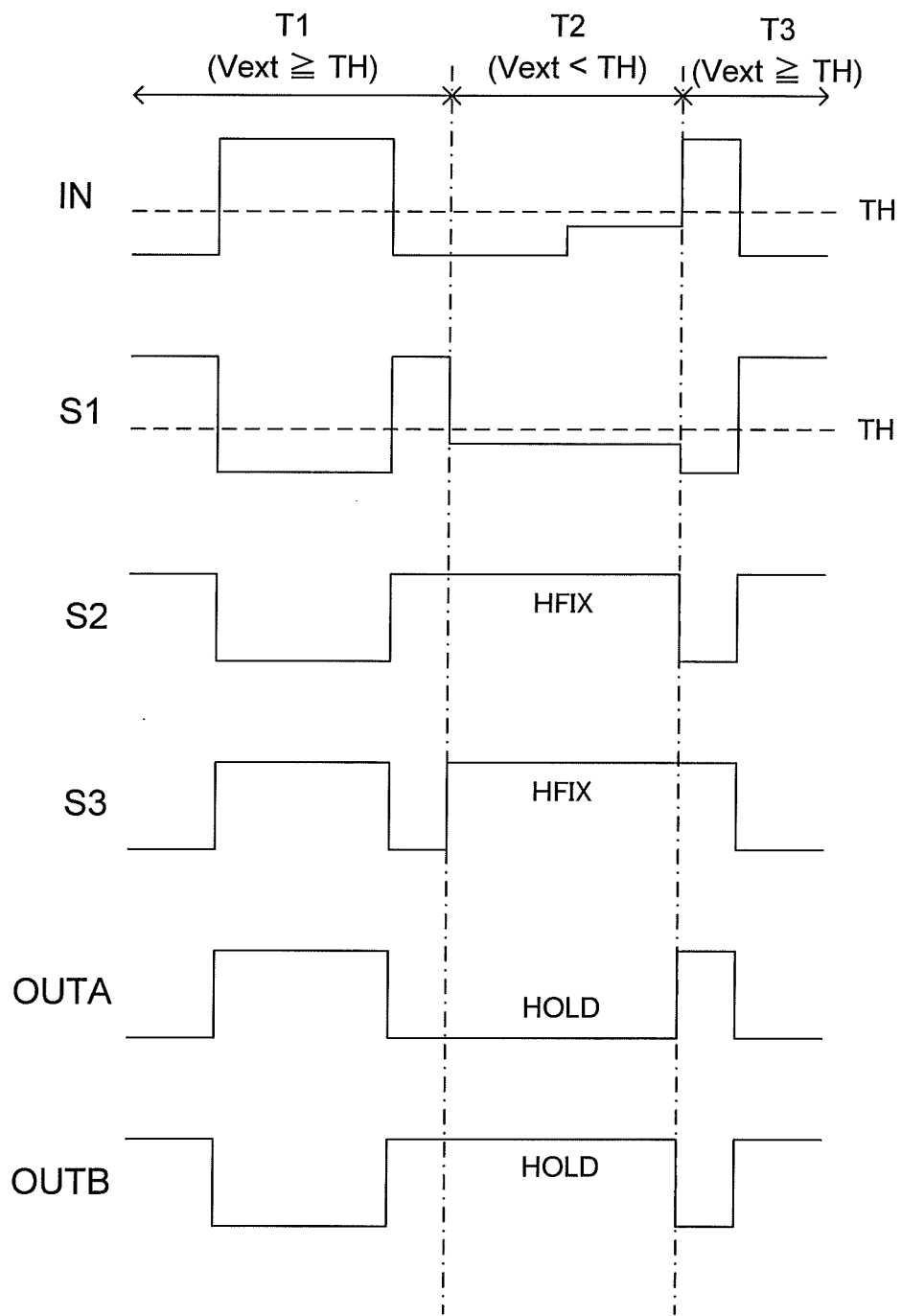
FIGS. 6 and 7 are time charts showing signal waveform examples of voltage levels when the external power supply voltage becomes not less than the logic threshold value of an inverter again after decreased less than the logic threshold value.
Figure 7:
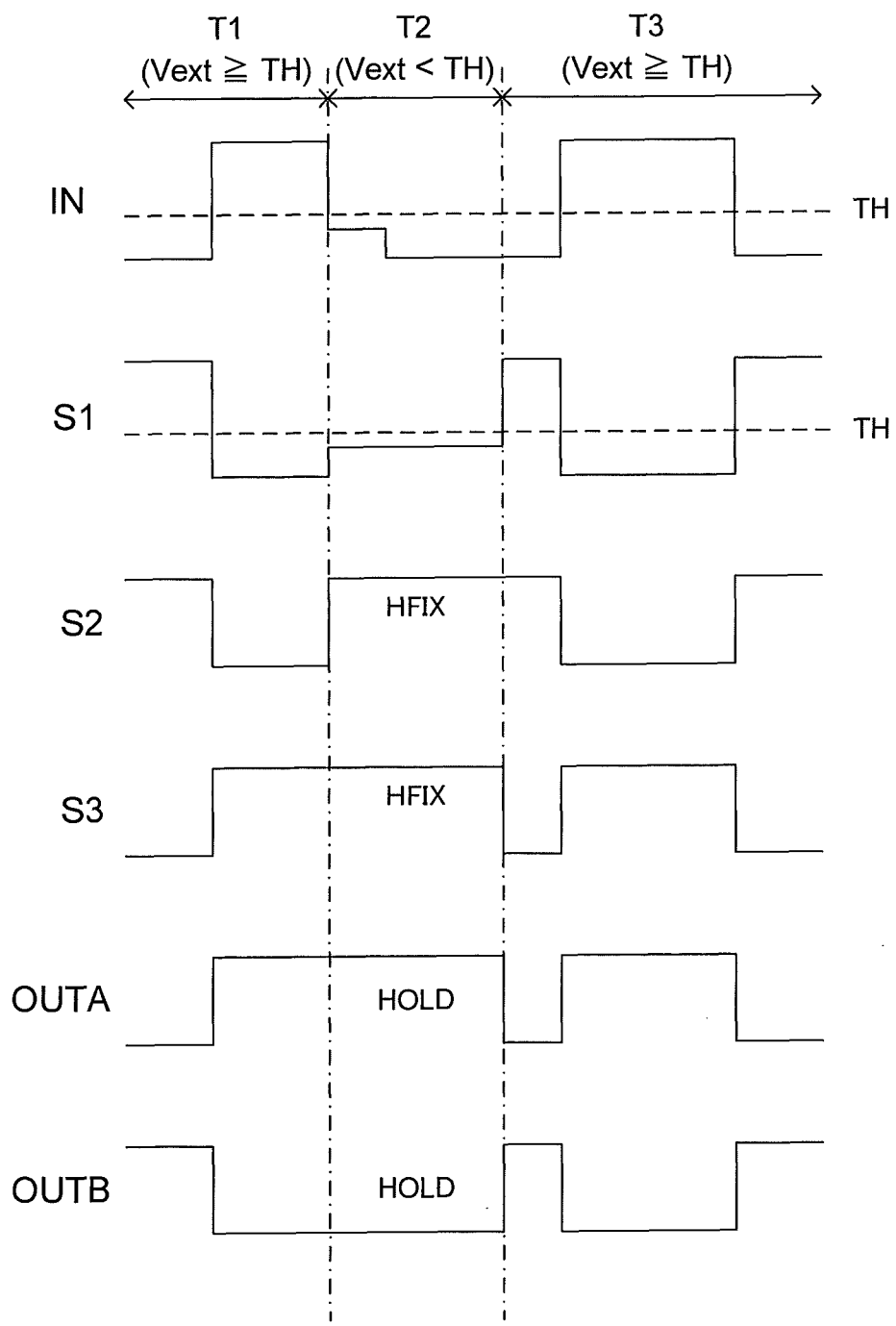

FIG. 6 is a time chart showing signal waveform examples of respective signals when the voltage level of the external power supply voltage Vext becomes not less than the logic threshold value TH, after the voltage level of the external power supply voltage Vext has decreased less than the logic threshold value TH in a timing of the input signal IN of low level as shown in FIG. 4. FIG. 7 is a time chart showing signal waveform examples of respective signals when the voltage level of the external power supply voltage Vext becomes not less than the logic threshold value TH, after the voltage level of the external power supply voltage Vext has decreased less than the logic threshold value TH in a timing of the input signal IN of high level as shown in FIG. 5.

In FIG. 6 and FIG. 7, Section T3 shows a section in which the external power supply voltage Vext becomes not less than the logic threshold value TH again (in other words, not less than the logic threshold values TH1-TH3) after Section T2. In Section T3, the signal level of the input signal IN becomes not less than the logic threshold value TH in the high level. Similarly, the signal level of the first output signal S1 becomes not less than the logic threshold value TH in the high level. Therefore, the second output signal S2 becomes a signal having the inverse logic to the input signal, and the third output signal S3 becomes a signal having the same logic as the input signal IN. Thus, in Section T3, the output signals OUTA and OUTB reflecting the input signal IN are generated as the interface output signal to be output.

As mentioned above, in the interface circuit 10 of the present invention, when the voltage level of the external power supply voltage Vext is decreased less than the logic threshold value TH (TH1-TH3) of each inverter, the latch circuit 14 maintains the signal levels of the output signals OUTA and OUTB of before the external power supply voltage Vext drops and then continues to output them as the interface output signal. Therefore, the embodiment makes it possible to prevent the malfunction of the interface circuit caused by the misjudgment of each inverter (specifically, deciding on a high level signal lower than the logic threshold value TH to be a low level).

Although, when the foregoing the misjudgment in the inverter 12 and the inverter 13 occurs, the second output signal S2 and the third output signal S3 become high levels. The latch circuit 14 maintains the values of the output signals OUTA and OUTB of before such a state and then, continues to output them as the interface output signals. By this, the input signal IN and the interface output signal are separated once, and transmission of the misjudgment result into the subsequent stage circuit can be prevented.

Furthermore, according to the present invention, in order to prevent malfunction, there is no need to provide separately any circuit having a large area and considerable consumed electric power such as an interruption signal generating circuit or the like other than the interface circuit. Therefore, it is possible to prevent a malfunction caused by dropping in the supply voltage while reducing the circuit scale and consumed electric power.

Figure 8:
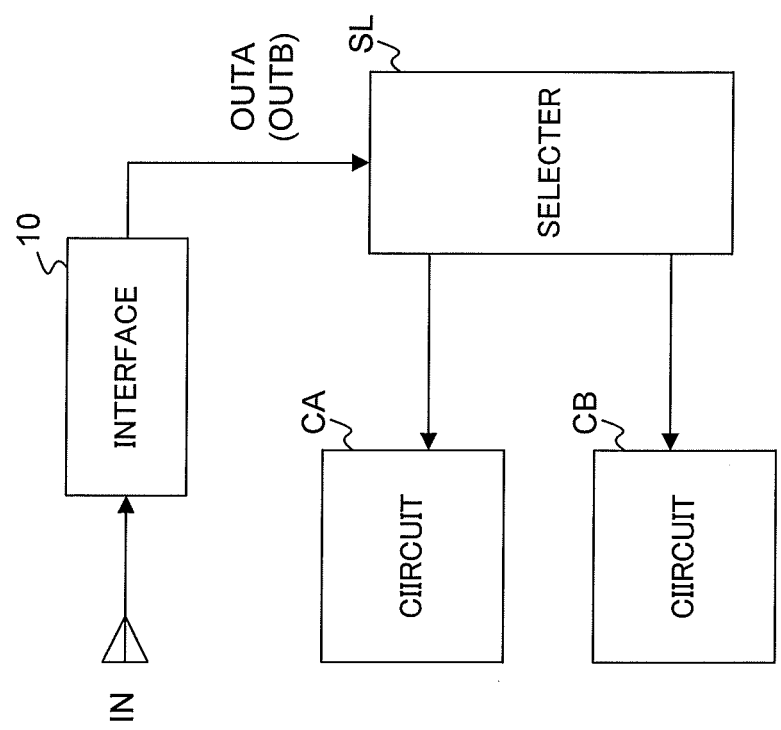
FIG. 8 is a block diagram showing an example using an interface circuit according to the present invention for a circuit being switched between two kinds of circuit blocks by an input signal supplied from the outside.

The interface circuit 10 of the present invention can be used for a switching circuit for switching between two kinds of circuit blocks, for example. As shown in FIG. 8, the interface circuit 10 receives the input signal IN and supplies the output signal OUTA (or OUTB) as the interface output signal to a selector SL. The selector SL performs an operation switching of circuit blocks CA and circuit blocks CB in response to the high or low level of the output signal OUTA (or OUTB). According to the interface circuit 10 of the present invention, even if the misjudgment of the inverter caused by fluctuation of the supply voltage occurs, the resultant misjudgment is not transmitted to the selector SL and the selector SL is not affected by the misjudgment. Thus the switching of the circuit blocks is achieved.

Furthermore, the interface circuit 10 of the present invention can be used for a switching circuit for switching a normal mode/test mode, for example.

Figure 9:
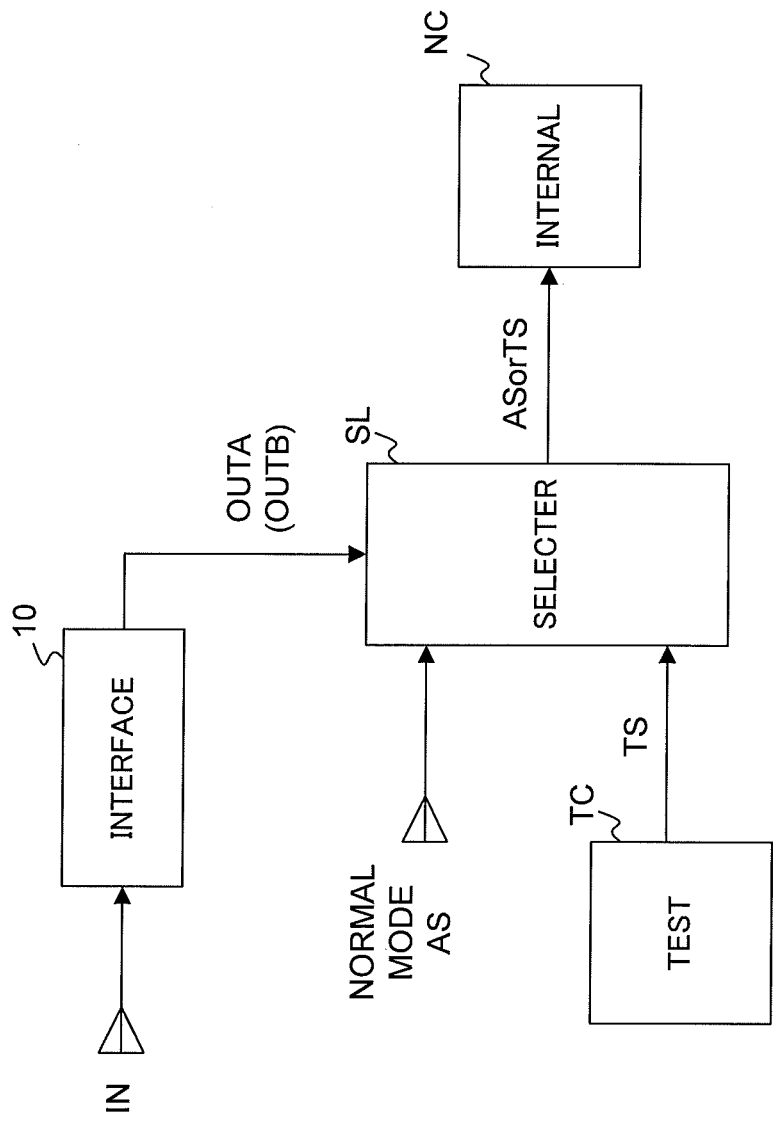
FIG. 9 is a block diagram showing an example using an interface circuit according to the present invention for a switching circuit of a normal mode/the test mode.

As shown in FIG. 9, the interface circuit 10 receives the input signal IN and supplies the output signal OUTA (or OUTB) as the interface output signal to the selector SL. The selector SL performs an operation switching of the actuating signal AS in the normal mode and test signal TS from a test circuit TC in response to the high or low level of the output signal OUTA (or OUTB) and then supplies the actuating signal AS or the test signal TS to the internal circuit NC. According to the interface circuit 10 of the present invention, even if the misjudgment of the inverter caused by fluctuation of the supply voltage occurs, the resultant misjudgment is not transmitted to the selector SL and the selector SL is not affected by the misjudgment. Thus the switching of the normal mode/test mode is achieved.

Furthermore, as shown in FIG. 1, in the present invention, there are two signal lines i.e. the first signal line connecting the inverter 12 and the NAND gate ND1 and the second signal line connecting the inverter 11, the inverter 13 and the NAND gate ND2 to which signals are transmitted complementarily. Although, when a signal is transmitted in one single signal line, only two output values of "H" and "L" must be taken in the signal generally, but according to the configuration of the present invention, it is possible to take four ways of output values ("H" and "H", "H" and "L", "L" and "H", and "L" and "L") in the signal. Further, the present invention enables to transmit and output the input signal intendedly, even in a situation in which the misjudgment of the inverter occurs due to fluctuation of supply voltage, by maintaining a just before value using the output value ("H" and "H") which differs from the output values ("H" and "L", "L" and "H") in a normal operation.

Embodiment 2

Figure 10:
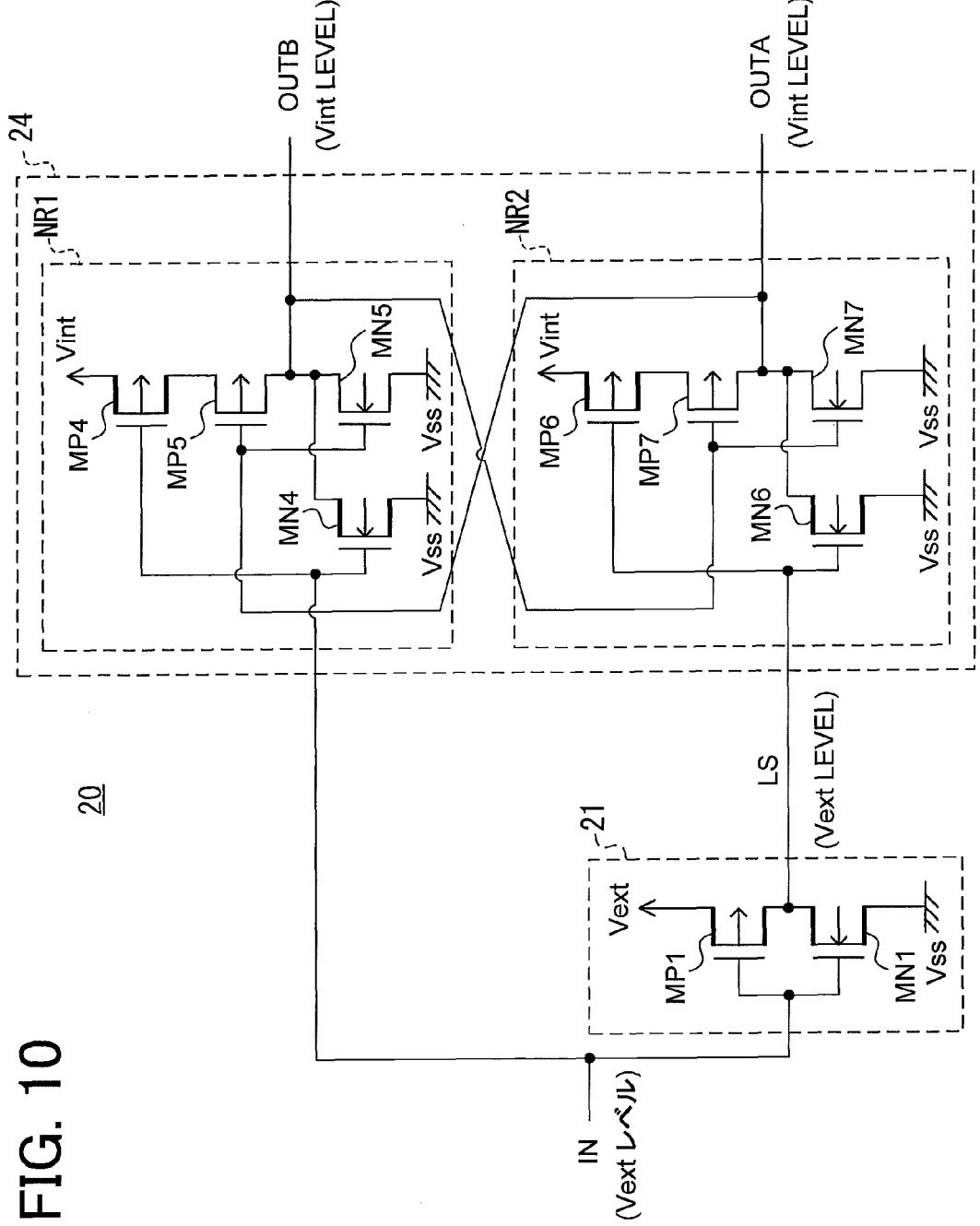
FIG. 10 is a block diagram showing an interface circuit of Embodiment 2.

FIG. 10 is a block diagram showing an interface circuit 20 of Embodiment 2. The interface circuit 20, similarly to the interface circuit 10 of Embodiment 1, receives an input signal IN and the generates output signals OUTA and OUTB on the basis of the external power supply voltage Vext and the internal power supply voltage Vint, and then supply them as the interface output signal to the subsequent stage circuit. The interface circuit 20 includes the inverter 21 and the latch circuit 24.

The inverter 21 is a semiconductor logic gate having the logic threshold value TH4 which is a value of ½ times of the voltage level of the external power supply voltage Vext. The inverter 21 outputs a logic gate signal LS of low level when a signal level of the input signal IN is not less than a logic threshold value TH4, alternatively outputs the logic gate signal LS of high level when a signal level of the input signal IN is less than the logic threshold value TH4. The inverter 21 is operated by applying the external power supply voltage Vext and the ground potential Vss thereto. Therefore, the logic gate signal LS becomes a rectangular wave having a potential in response to the external power supply voltage Vext (the first voltage) in the high level and having the ground potential in the low level.

The latch circuit 24 is composed of the NOR gate NR1 and the NOR gate NR2. The latch circuit 24 fetches the logic gate signal LS and the input signal IN as the first latch signal and the second latch signal and then outputs the output signals OUTA and OUTB.

The NOR gate NR1 is composed of the PMOS transistor MP4, the PMOS transistor MP5, the NMOS transistor MN4 and the NMOS transistor MN5. The PMOS transistor MP4 and the NMOS transistor MN4 are composed of high breakdown voltage transistors. Further the PMOS transistor MP5 and the NMOS transistor MN5 are composed of low breakdown voltage transistors.

The source terminal of the PMOS transistor MP4 is applied with the internal power supply voltage Vint. The drain terminal of the PMOS transistor MP4 is connected to the source terminal of the PMOS transistor MP5. The drain terminal of the PMOS transistor MP5 is connected to each drain terminal of the NMOS transistor MN4 and the NMOS transistor MN5. The source terminals of the NMOS transistor MN4 and the NMOS transistor MN5 are grounded and the ground potential Vss is applied thereto. The gate terminal of the PMOS transistor MP4 and the gate terminal of the NMOS transistor MN4 are connected to each other and receive the input signal IN. The gate terminals of the PMOS transistor MP5 and the NMOS transistor MN5 are connected to each other and receive the output signal OUTA from the NOR gate NR2.

The NOR gate NR2 is composed of the PMOS transistor MP6, the PMOS transistor MP7, the NMOS transistor MN6 and the NMOS transistor MN7. The PMOS transistor MP6 and the NMOS transistor MN6 are composed of high breakdown voltage transistors. Further the PMOS transistor MP7 and the NMOS transistor MN7 are composed of low breakdown voltage transistors.

The source terminal of the PMOS transistor MP6 is applied with the internal power supply voltage Vint. The drain terminal of the PMOS transistor MP6 is connected to the source terminal of the PMOS transistor MP7. The drain terminal of the PMOS transistor MP7 is connected to each drain terminal of the NMOS transistor MN6 and the NMOS transistor MN7. The source terminals of the NMOS transistor MN6 and the NMOS transistor MN7 are grounded and the ground potential Vss is applied thereto. The gate terminal of the PMOS transistor MP6 and the gate terminal of the NMOS transistor MN6 are connected to each other and receive the logic gate signal LS from the inverter 21. The gate terminals of the PMOS transistor MP7 and the NMOS transistor MN7 are connected to each other and receive the output signal OUTB from the NOR gate NR1.

The latch circuit 24 is a semiconductor logic gate having the logic threshold value (latch threshold) TH5. The logic threshold value TH5 has a value of ½ times of the voltage level of the internal power supply voltage Vint applied to the NOR gate NR1 and the NOR gate NR2. The latch circuit 24 receives the input signal IN and the logic gate signal LS and generates the output signals OUTA and OUTB.

FIG. 11 is a truth table showing relationships the signal levels of the input signal IN and the logic gate signal LS to the signal levels of the output signals OUTA and OUTB. The latch circuit 24 generates the output signals OUTA and OUTB with the signal levels shown in the foregoing truth table in response that each signal level of the input signal IN and the logic gate signal LS is higher (a high level) or lower (a low level) than the logic threshold value TH5.

When the input signal IN is in a low level ("L" in the figure) and the logic gate signal LS is in a high level ("H" in the figure), the latch circuit 24 outputs the output signal OUTA of low level and the output signal OUTB of high level. Whereas when the input signal IN is in a high level and the logic gate signal LS is in a low level, the latch circuit 24 outputs the output signal OUTA of high level and the output signal OUTB of low level. Furthermore, when the input signal IN is in a low level and the logic gate signal LS is in a low level, the latch circuit 24 maintains the states of signal levels of the output signals OUTA and OUTB just before transition, and outputs the output signals OUTA and OUTB having such signal levels as the interface output signals.

Next, operation of the interface circuit 20 of the present invention will be described with reference to FIG. 12-FIG. 14.

Figure 12:
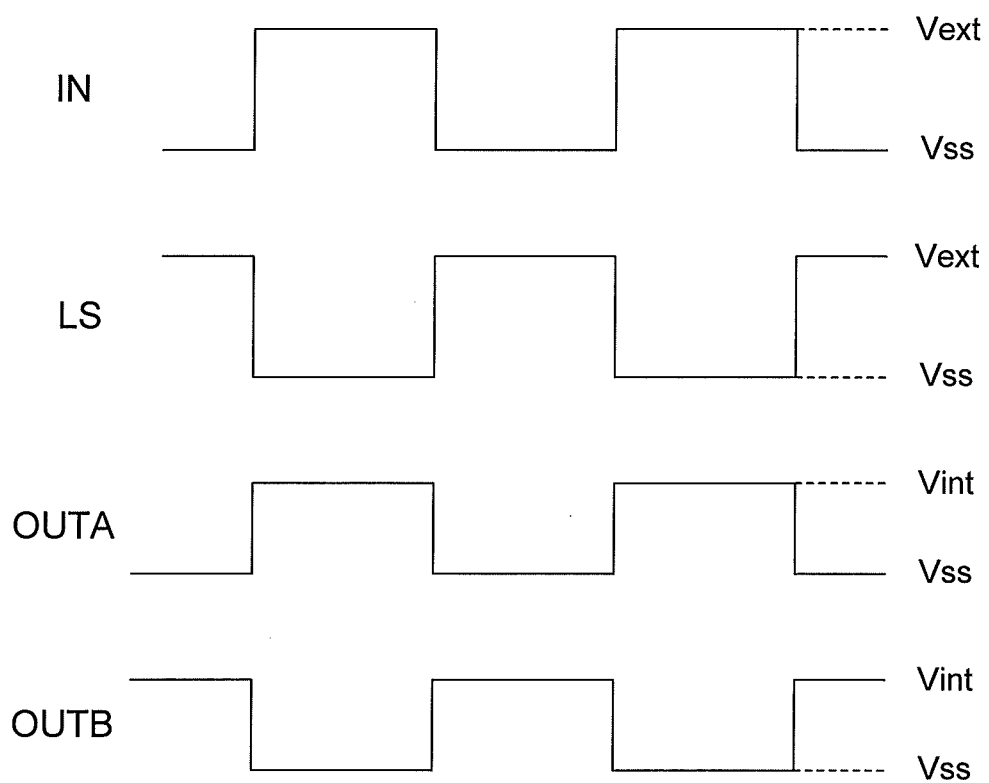
FIG. 12 is a time chart showing signal waveform examples of voltage levels in a normal operation state.

FIG. 12 is a time chart showing signal waveform examples of the input signal IN, the logic gate signal LS, the output signals OUTA and OUTB in a state that the interface circuit 20 performs the normal operation (in other words, the external power supply voltage Vext is not decreased).

When the input signal IN is in a high level (Vext level), the inverter 21 outputs the logic gate signal LS of low level. The latch circuit 24 receives the input signal IN of high level and the logic gate signal LS of low level, and then outputs the output signal OUTA of high level (Vint level) and the output signal OUTB of low level.

Whereas when the input signal IN is in a low level, the inverter 21 outputs the logic gate signal LS of high level (Vext level). The latch circuit 24 receives the input signal IN of low level and the logic gate signal LS of high level and then outputs the output signal OUTA of low level and the output signal OUTB of high level (Vint level).

Next, there will be described an operation of the interface circuit 20 in that the voltage level of the external power supply voltage Vext is decreased, and the logic threshold value TH4 in the inverter 21 and the logic threshold value TH5 in the latch circuit 24 (hereinafter, these are also called "logic threshold value TH" collectively).

Figure 13:
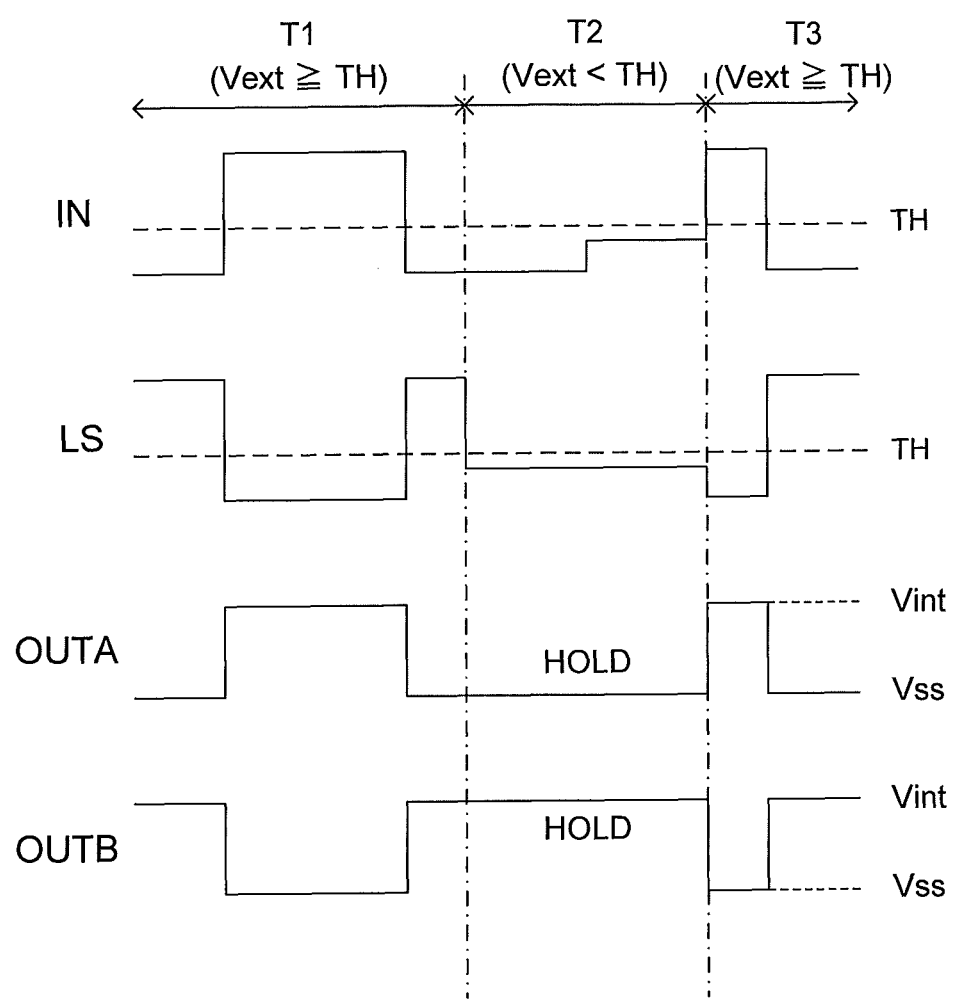
FIG. 13 is a time chart showing signal waveform examples of voltage levels when an external power supply voltage decrease less than the logic threshold value in a period of time an input signal is in a low level.
Figure 14:
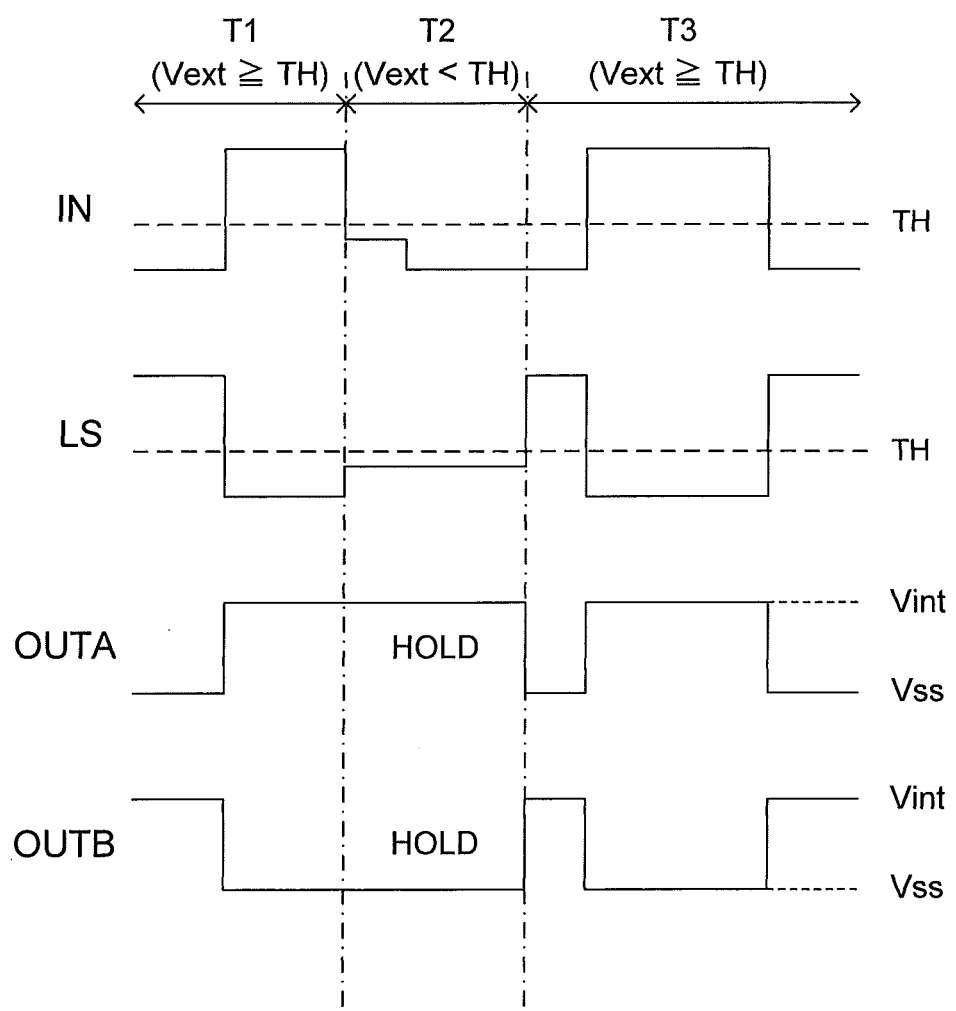
FIG. 14 is a time chart showing signal waveform examples of voltage levels when an external power supply voltage decrease less than the logic threshold value in a period of time an input signal is in a high level.

FIG. 13 is a time chart showing signal waveform examples of voltage levels when the voltage level of the external power supply voltage Vext is decreased less than the logic threshold values TH4 and TH5 in a timing of the input signal IN of low level.

Further FIG. 5 is a time chart showing signal waveform examples of voltage levels when the voltage level of the external power supply voltage Vext is decreased less than the logic threshold values TH4 and TH5 in a timing of the input signal IN of high level.

When the voltage level of the external power supply voltage Vext becomes less than the logic threshold value TH (TH4 and TH5) (Section T2 in the figure), the signal level of the input signal IN in the high level state becomes less than the logic threshold value TH. The inverter 21 decides that the input signal IN of low level is supplied and then outputs the logic gate signal LS of high level. However, since the signal level of the logic gate signal LS is equal to the voltage level the external power supply voltage Vext, the signal level of the logic gate signal LS is less than the logic threshold value TH.

The latch circuit 24 is supplied with the input signal IN and the logic gate signal LS each having the signal level less than the logic threshold value TH. Therefore, the latch circuit 24 decides that the input signal IN and the logic gate signal LS of low level are supplied to itself and then maintains the signal levels of the output signals OUTA and OUTB at the signal levels of just before transition.

After that, when the voltage level of the external power supply voltage Vext exceeds the logic threshold value TH (TH4 and TH5) again (Section T3 in the figure), the interface circuit 20 returns to the normal operation, the latch circuit 24 outputs the output signals OUTA and OUTB according to the truth table of FIG. 11.

As mentioned above, in the interface circuit 20 of the present invention, when the voltage level of the external power supply voltage Vext is decreased less than the logic threshold value TH, the latch circuit 24 maintains the signal levels of the output signals OUTA and OUTB of before the external power supply voltage Vext drops and then continues to output them as the interface output signal. Therefore, the circuit malfunction caused by the voltage fluctuation can be prevented.

Furthermore, the interface circuit 20 of the present embodiment comprises one inverter (21), one latch circuit (24), six high breakdown voltage transistors (MP1, MN1, MP4, MN4, MP6 and MN6) and four low breakdown voltage transistors (MP5, MN5, MP7 and MN7). In contrast, the interface circuit 10 of Embodiment 1 comprises three inverters (11, 12, and 13) and one latch circuit (14), wherein each inverter includes six high breakdown voltage transistors, and the latch circuit includes eight low breakdown voltage transistors. Therefore, the interface circuit 20 of the present embodiment is smaller in circuit scale than the interface circuit 10 of Embodiment 1.

Furthermore, the interface circuit 20 of the present embodiment includes three gates, i.e. the inverter 21, the NOR gate NR1 and the NOR gate NR2. Therefore, the number of gate is small in the present embodiment in comparison with the interface circuit 10 of Embodiment 1 including five gates, i.e. the first inverter 11, the second inverter 12, the third inverter 13, the NAND gate ND1 and the NAND gate ND2. Thus, consumed electric power (operating power, standby power) can be suppressed.

Furthermore, in the interface circuit 20 of the present embodiment, there are three stages of gates at maximum through which the input signal IN passes as the output signals OUTA and OUTB until output. Thus, the interface circuit 20 of the present embodiment has a short time it takes for the output signals OUTA and OUTB to pass through the gates (delay time) in comparison with the interface circuit 10 of Embodiment 1 including four stages of gates.

Embodiment 3

Figure 15:
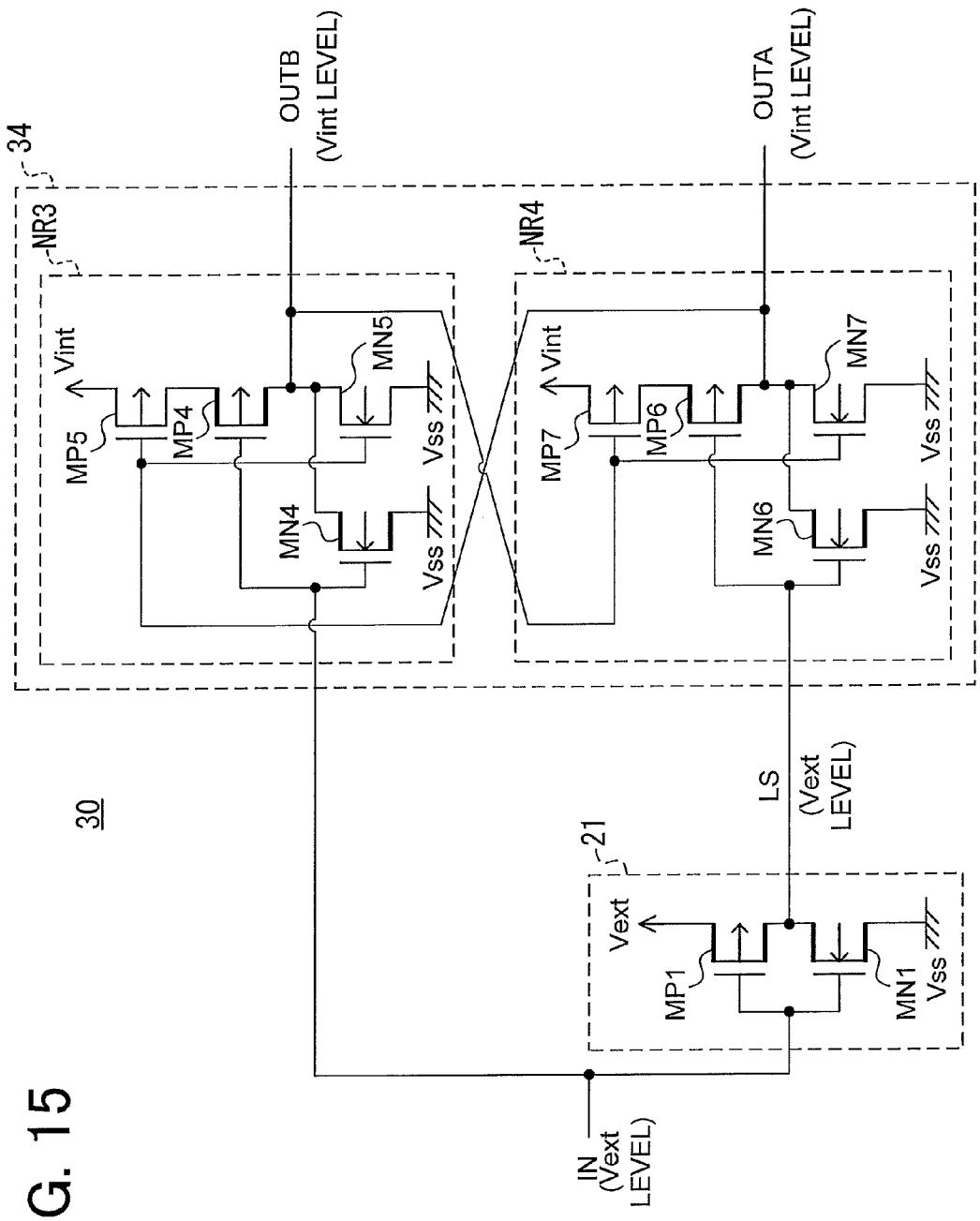
FIG. 15 is a block diagram showing an interface circuit of Embodiment 3.

FIG. 15 is a block diagram showing an interface circuit 30 of Embodiment 3. The interface circuit 30, similarly to the interface circuit 10 of Embodiment 1 and the interface circuit 20 of Embodiment 2, receives an input signal IN and the generates output signals OUTA and OUTB on the basis of the external power supply voltage Vext and the internal power supply voltage Vint, and then supply them as the interface output signal to the subsequent stage circuit.

The interface circuit 30 includes the inverter 21 and the latch circuit 34. The latch circuit 34 is composed of the NOR gate NR3 and the NOR gate NR4.

The NOR gate NR3 is composed of the PMOS transistor MP4, the PMOS transistor MP5, the NMOS transistor MN4 and the NMOS transistor MN5. The PMOS transistor MP4 and the NMOS transistor MN4 are composed of high breakdown voltage transistors. Further the PMOS transistor MP5 and the NMOS transistor MN5 are composed of low breakdown voltage transistors.

The PMOS transistor MP5 の the source terminal is applied with the internal power supply voltage Vint. The drain terminal of the PMOS transistor MP5 is connected to the source terminal of the PMOS transistor MP4. The drain terminal of the PMOS transistor MP4 is connected to each drain terminal of the NMOS transistor MN4 and the NMOS transistor MN5. Each source terminal of the NMOS transistor MN4 and the NMOS transistor MN5 is grounded and the ground potential Vss is applied thereto. The gate terminals of the PMOS transistor MP4 and the NMOS transistor MN4 are connected to each other and receive the input signal IN. The gate terminals of the PMOS transistor MP5 and the NMOS transistor MN5 are connected to each other and receive the output signal OUTA from the NOR gate NR4.

The NOR gate NR4 is composed of the PMOS transistor MP6, the PMOS transistor MP7, the NMOS transistor MN6 and the NMOS transistor MN7. The PMOS transistor MP6 and the NMOS transistor MN6 are composed of high breakdown voltage transistors. Further the PMOS transistor MP7 and the NMOS transistor MN7 are composed of low breakdown voltage transistors.

The source terminal of the PMOS transistor MP7 is applied with the internal power supply voltage Vint. The drain terminal of the PMOS transistor MP7 is connected to the source terminal of the PMOS transistor MP6. The drain terminal of the PMOS transistor MP6 is connected to each drain terminal of the NMOS transistor MN6 and the NMOS transistor MN7. Each source terminals of the NMOS transistor MN6 and the NMOS transistor MN7 is grounded and is applied with the ground potential Vss. The gate terminal of the PMOS transistor MP6 and the gate terminal of the NMOS transistor MN6 are connected to each other and receives the logic gate signal LS from the inverter 21. The gate terminals of the PMOS transistor MP7 and the NMOS transistor MN7 are connected to each other and receives the output signal OUTB from the NOR gate NR3.

The latch circuit 34 is a semiconductor logic gate having the logic threshold value (latch threshold) TH5. In the latch circuit 34 of the present embodiment, each source terminal of the PMOS transistor MP5 and the PMOS transistor MP7 of low breakdown voltage transistors is applied with the internal power supply voltage Vint, and the PMOS transistor MP4 and the PMOS transistor MP6 of high breakdown voltage transistors are connected to output lines of the output voltage (OUTA and OUTB). In these points, the present embodiment differs from the latch circuit 24 of Embodiment 2.

However, the latch circuit 34 is similar to the latch circuit 24 of Embodiment 2 and outputs the output signals OUTA and OUTB according to the truth table of FIG. 11.

In other words, when the input signal IN is in a low level and the logic gate signal LS is in a high level, the latch circuit 24 outputs the output signal OUTA of low level and the output signal OUTB of high level. Whereas when the input signal IN is in a high level and the logic gate signal LS is in a low level, the latch circuit 24 outputs the output signal OUTA of high level and the output signal OUTB of low level. Furthermore, when the input signal IN is in a low level and the logic gate signal LS is in a low level, the latch circuit 24 maintains the states of signal levels of the output signals OUTA and OUTB just before transition, and outputs the output signals OUTA and OUTB having such signal levels as the interface output signals.

Furthermore, the latch circuit 34, similarly to the latch circuit 24 of Embodiment 2, is a semiconductor logic gate having the logic threshold value (latch threshold) TH5. Therefore, the latch circuit 34 performs the same operation as the latch circuit 24 of Embodiment 2 in the both states that the interface circuit 20 is in the normal operation and the voltage level of the external power supply voltage Vext becomes less than the logic threshold value TH. In other words, in the interface circuit 30 of the present embodiment, when the voltage level of the external power supply voltage Vext is decreased less than the logic threshold value TH, the latch circuit 34 maintains the signal levels of the output signals OUTA and OUTB of before the external power supply voltage Vext drops and then continues to output them as the interface output signal.

Therefore, according to the interface circuit 30 of the present embodiment, the circuit malfunction caused by the voltage fluctuation can be prevented.

Embodiment 4

Figure 16:
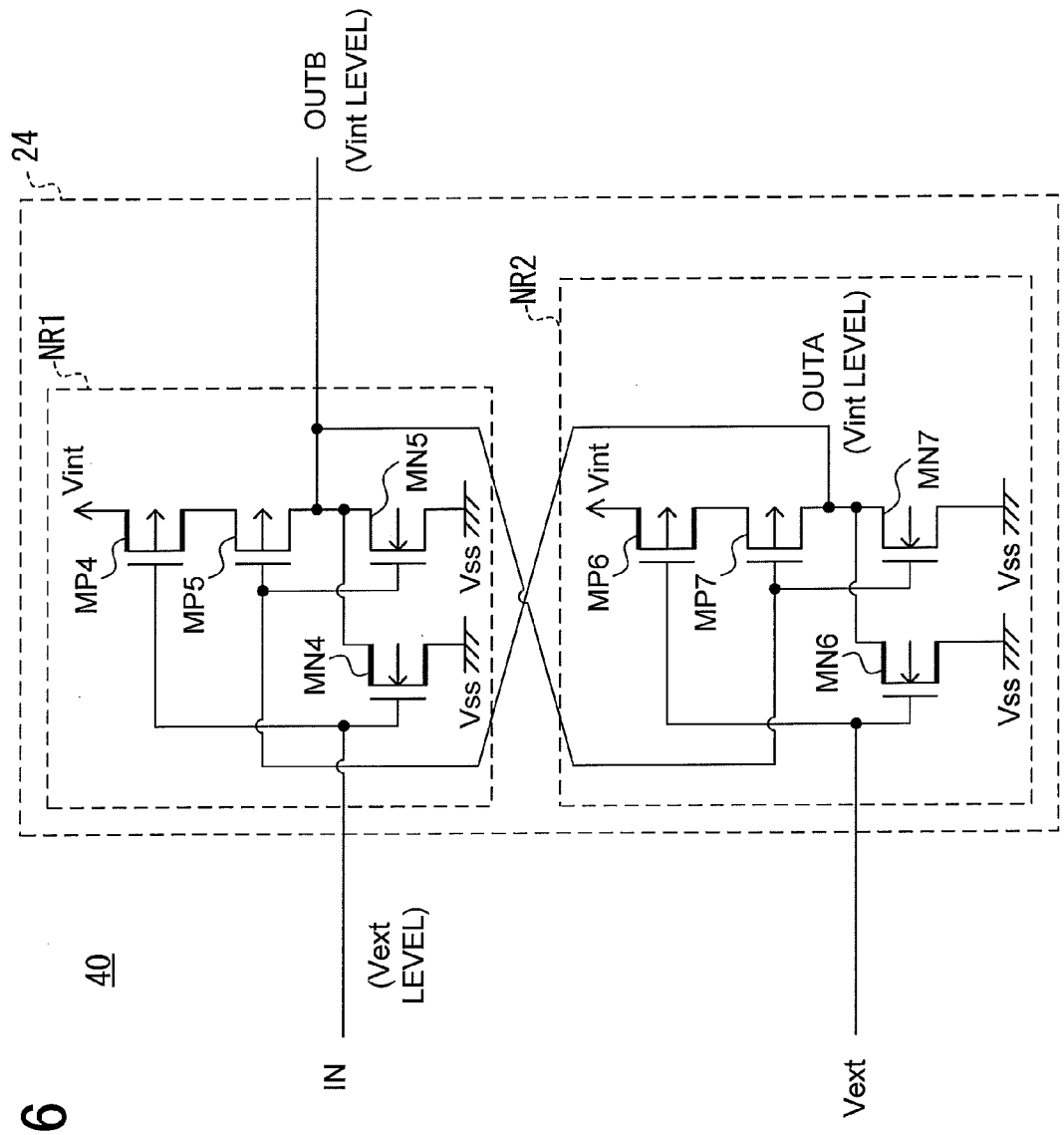
FIG. 16 is a block diagram showing an interface circuit of Embodiment 4.

FIG. 16 is a block diagram showing an interface circuit 40 of Embodiment 4. The interface circuit 40 receives an input signal IN and the external power supply voltage Vext and the generates the output signal OUTB on the basis of the external power supply voltage Vext and the internal power supply voltage Vint, and then supply them as the interface output signal to the subsequent stage circuit. The interface circuit 40 differs from the interface circuit 20 of Embodiment 2 in that the inverter is absent, in that the external power supply voltage Vext is supplied to the latch circuit 24 in addition to the input signal IN, and in that the output signal OUTA is not output to the subsequent stage circuit (outside of the interface circuit 40).

The interface circuit 40, similarly to the interface circuit 20 of Embodiment 2, comprises the latch circuit 24 having the NOR gate NR1 and the NOR gate NR2. However, the interface circuit 40 differs from Embodiment 2 in that each gate terminal of the PMOS transistor MP6 and the NMOS transistor MN6 constituting the NOR gate NR2 is applied with the external power supply voltage Vext.

Next, operation of the interface circuit 40 of the present invention will be described with reference to FIG. 17-FIG. 19.

Figure 17:
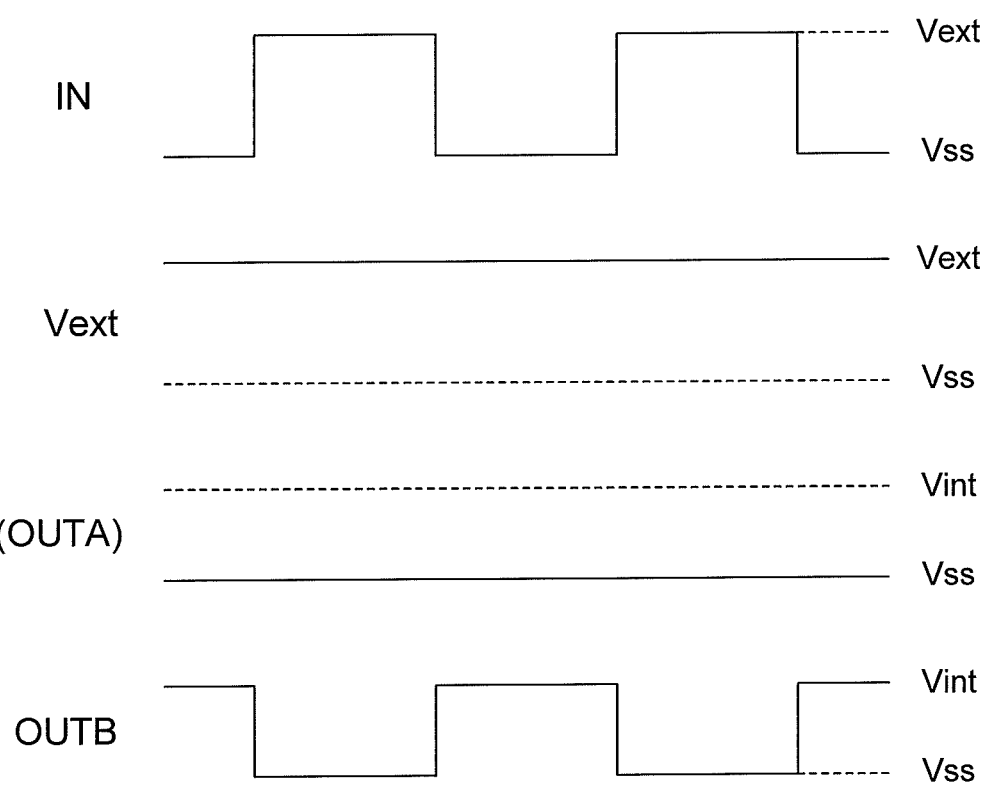
FIG. 17 is a time chart showing signal waveform examples of respective signals in a normal operation.

FIG. 17 is a time chart showing signal waveform examples i.e., the input signal IN, the external power supply voltage Vext, the output signals OUTA and OUTB in the interface circuit 40 of the normal operation state (i.e., the external power supply voltage Vext is not decreased).

In the normal operation of the interface circuit 40, the external power supply voltage Vext has a constant voltage value (Vext level). Therefore, the output signal OUTA is always of a low level (Vss level). Whereas the output signal OUTB becomes a signal having a variable signal level in an opposite phase to the input signal IN (i.e. signal having the inverse logic). In other words, the output signal OUTB has a low level (Vss level) when the input signal IN is in a high level (Vext level) and a high level (Vint level) when the input signal IN is in a low level (Vss level).

Next, there will be described an operation of the interface circuit 40 in that the voltage level of the external power supply voltage Vext is decreased less than the logic threshold value TH5 of the latch circuit 24.

Figure 18:
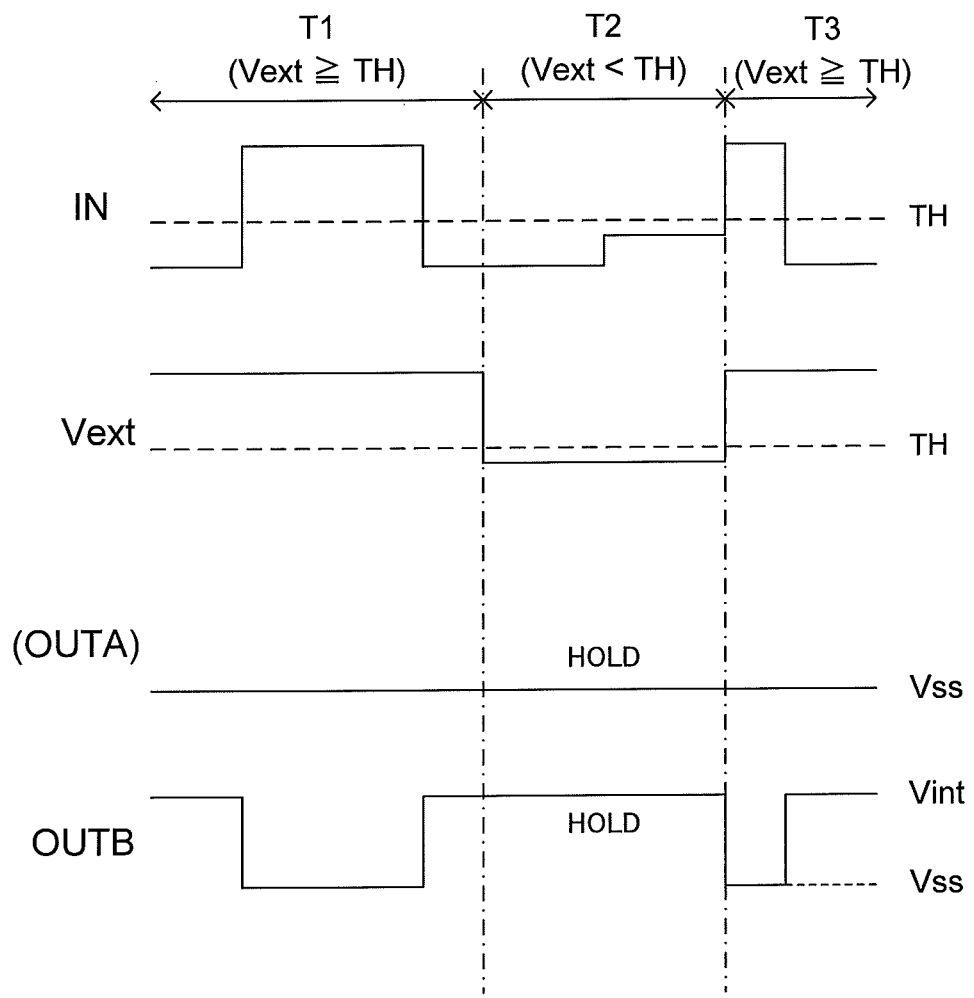
FIG. 18 is a time chart showing signal waveform examples of voltage levels when an external power supply voltage decrease less than the logic threshold value in a period of time in which an input signal is in a low level.

FIG. 18 is a time chart showing signal waveform examples of voltage levels when the voltage level of the external power supply voltage Vext is decreased less than the logic threshold value TH5 in a timing in which the input signal IN of low level.

When the voltage level of the external power supply voltage Vext becomes less than the logic threshold value TH5 (Section T2 in the figure), after that, the signal level of the input signal IN even in the high level state is less than the logic threshold value TH.

The latch circuit 24 is supplied with the input signal IN and the external power supply voltage Vext having signals levels less than the logic threshold value TH5. Therefore, the latch circuit 24 decides that the input signal IN and the logic gate signal LS of low level are supplied to itself and then maintains the signal levels of the output signals OUTA and OUTB at the signal levels of just before transition. In other words, the output signal OUTA becomes a low level and, the output signal OUTB becomes a high level.

When, after that, the voltage level of the external power supply voltage Vext exceeds the logic threshold value TH5 again (Section T3 in the figure), the interface circuit 40 returns to the normal operation. In other words, the output signal OUTA is maintained at the low level, and the output signal OUTB becomes the signal having a variable signal level in an opposite phase to the input signal IN (i.e. signal having the inverse logic).

Figure 19:
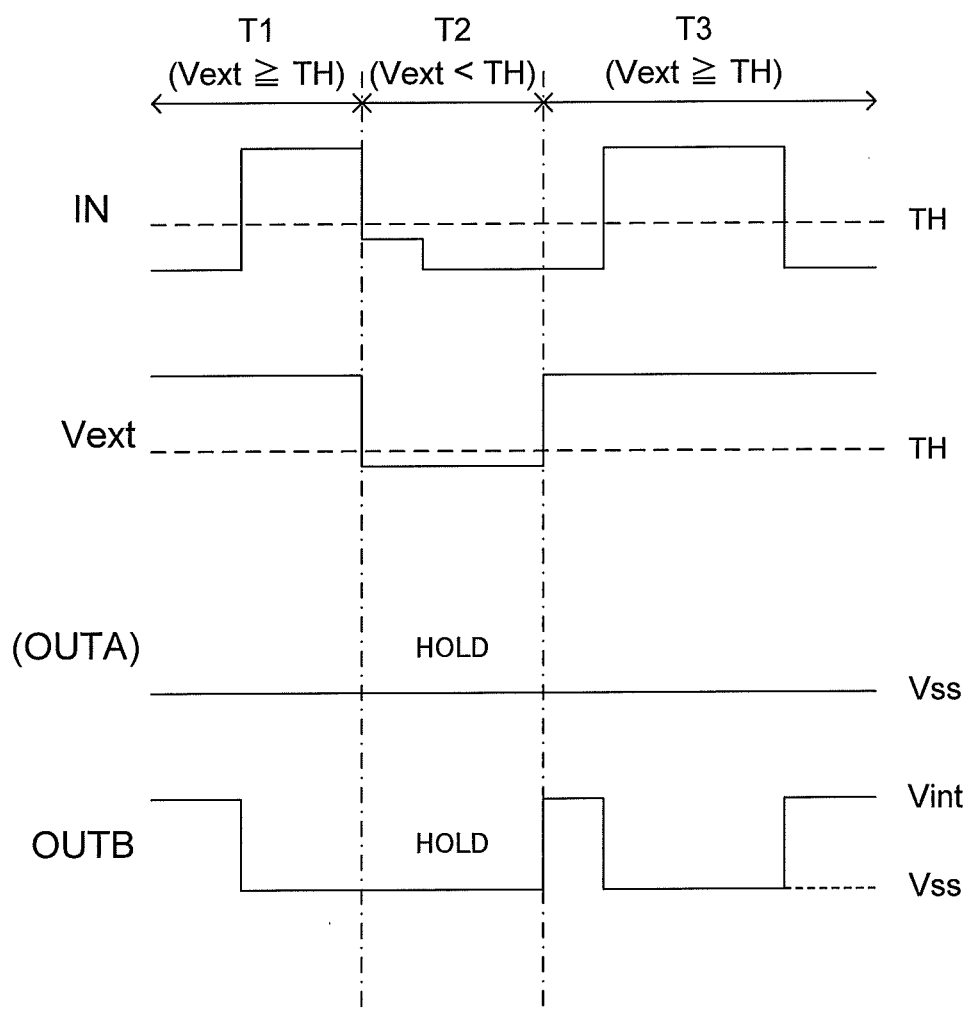
FIG. 19 is a time chart showing signal waveform examples of voltage levels when an external power supply voltage decrease less than the logic threshold value in a period of time in which an input signal is in a high level.

FIG. 19 is a time chart showing signal waveform examples of voltage levels when the voltage level of the external power supply voltage Vext is decreased less than the logic threshold value TH5 in a timing in which the input signal IN of high level.

When the voltage level of the external power supply voltage Vext becomes less than the logic threshold value TH5 (Section T2 in the figure), the signal level of the input signal IN even in the high level state is less than the logic threshold value TH.

The latch circuit 24 is supplied with the input signal IN and the external power supply voltage Vext each having the signal level less than the logic threshold value TH. Therefore, the latch circuit 24 decides that the input signal IN and the external power supply voltage Vext of low level are supplied to itself and then maintains the signal levels of the output signals OUTA and OUTB at the signal levels of just before transition. Namely, both the output signal OUTA and the output signal OUTB become the low level.

When, after that, the voltage level of the external power supply voltage Vext exceeds the logic threshold value TH5 again (Section T3 in the figure), the interface circuit 40 returns to the normal operation. In other words, the output signal OUTA is maintained at the low level, and the output signal OUTB becomes the signal having a variable signal level in an opposite phase to the input signal IN (i.e. signal having the inverse logic).

As mentioned above, according to the interface circuit 40 of the present embodiment, even if the voltage level of the external power supply voltage Vext is decreased less than the logic threshold value TH5, the signal level of the output signal OUTB of before the external power supply voltage Vext drops is maintained and then continued to output the signal as the interface output signal. Therefore, the circuit malfunction caused by the voltage fluctuation can be prevented.

Furthermore, the interface circuit 40 of the present embodiment differs from the interface circuit (20, 30) of Embodiment 2 and Embodiment 3 in that the inverter 21 is absence. Therefore, the interface circuit 40 is composed of four high breakdown voltage transistors (MP4, MN4, MP6 and MN6) and four low breakdown voltage transistors (MP5, MN5, MP7 and MN7). Thus, the interface circuit 40 of the present embodiment can be minimized in circuit scale in comparison with the interface circuit 20 of Embodiment 2 and the interface circuit 30 of Embodiment 3.

Furthermore, the interface circuit 40 of the present embodiment comprises two gates i.e. NOR gate NR1 and the NOR gate NR2. Therefore, the number of gates in the interface circuit 40 is small in comparison with the interface circuits of Embodiments 2 and 3 which have the inverter 21, the NOR gate NR1 and the NOR gate NR2 (or the NOR gate NR3 and the NOR gate NR4), i.e. total three gates. Thus, consumed electric power (operating power, standby power) can be suppressed.

Furthermore, according to the interface circuit 40 of the present embodiment, number of gates is at most 2-stage in which the signal passes therethrough during from the input of the input signal IN to the output of the output signal OUTB. Therefore, the present embodiment can further shorten the time (delay time) taken from the input of the input signal IN to the output of the output signal OUTB in comparison with Embodiments 2 and 3 in which the number of stages of the gate the signal passing therethrough is the largest three-stages.

In addition, the present invention is not limited by the foregoing Embodiments. For example, the foregoing Embodiments have been explained such that the internal power supply voltage Vint is a voltage generated by converting the external power supply voltage Vext with the voltage converter or the like. However, the present invention is not limited by this, the internal power supply voltage Vint can be generated separately and independently from the external power supply voltage Vext. In other words, the present invention is widely applicable to situations e.g. the first voltage (applied to the input logic gate input with the input signal IN) the second voltage (applied to the subsequent stage logic gate) have independent voltage values wherein the voltage level of the first voltage can be shut down or lowered less than the second voltage.

Furthermore, the foregoing Embodiments have been explained such that the external power supply voltage Vext is higher than the internal power supply voltage Vint in the normal operation. However, the external power supply voltage Vext and the internal power supply voltage Vint can be substantially the same in the normal operation.

Furthermore, the foregoing Embodiment 1 has been explained such that the high breakdown voltage transistors are used for transistors which constitute the first inverter 11, the second inverter 12 and the third inverter 13. However, the withstand voltage characteristic of the transistors which constitute each inverter is not limited by this. The transistors which constitute each inverter may have a withstand voltage characteristic capable of withstanding at least the external power supply voltage Vext (the first voltage) and the internal power supply voltage Vint (the second voltage).

Furthermore, in the foregoing Embodiment 1, there are explained that the first—the third inverter (11-13) are composed of high breakdown voltage transistors, the NAND gate ND1 and ND2 are composed of low breakdown voltage transistors. Furthermore, in the Embodiments 2-4, there are explained of the NOR gate NR1-NR4 of high breakdown voltage transistors and low breakdown voltage transistors. However, all transistors can be constituted by transistors of the same breakdown voltage characteristic. In other words, the interface circuit of the present invention can be constituted by using transistors of the same breakdown voltage, or by combining transistors having different breakdown voltage characteristics.

Furthermore, the foregoing Embodiments have been explained such that the logic threshold value of each of the inverter and the latch circuit has a value of ½ times of voltage level of the supply voltage applied to each of the inverter and the latch (in other words, the logic threshold value TH1 and TH4 is ½ times of Vext, and each of the logic threshold value TH2, TH3 and TH5 is ½ times of Vint). However, the logic threshold value of each inverter and the latch circuit is not limited by this value. Furthermore, the logic threshold values of the first inverter 11, the second inverter 12 and the third inverter 13 may be different from one another, alternatively may be the same value. Similarly, the logic threshold values of the inverter 21 and the latch circuit 24 (34) may be different from one another, alternatively may be the same value. The logic threshold values of the first inverter 11, the second inverter 12, the third inverter 13, the inverter 21, the latch circuit 24 and 34 can be a value lower than at least a voltage level of the supply voltage is applied to each inverter and the latch circuit.

Furthermore, in the foregoing Embodiments, there are explained that the latch circuit 14 is composed of the NAND gate ND1 and the NAND gate ND2. However, by this the configuration of the latch circuit 14 is not limited. For example, the latch circuit 14 can be configured by using the NOR gate or the like.

Furthermore, the truth table relating to each operation of the latch circuits is not limited by the table shown in FIG. 2 and FIG. 11. For example, in the truth table of FIG. 2, when the second output signal S2 is "L" and the third output signal S3 is "H", then the output signal OUTA is "H" and the output signal OUTB is "L", and when the second output signal S2 is "H" and the third output signal S3 is "L", then the output signal OUTA is "L" and the output signal OUTB is "H". However, aside from this, the latch circuit 14 can be configured as follows: when the second output signal S2 is "L" and the third output signal S3 is "H", then the output signal OUTA is "L" and the output signal OUTB is "H", and when the second output signal S2 is "H" and the third output signal S3 is "L", then the output signal OUTA is "H" and the output signal OUTB is "L."

Furthermore, in the foregoing Embodiments, there are explained that the latch circuit 14 generates he output signals OUTA and OUTB and outputs them the interface output signal. However, the latch circuit 14 can supply at least one of OUTA or OUTB as the interface output signal to the subsequent stage circuit.

Furthermore, in addition to the interface circuit 40 of the foregoing Embodiment 4 in which both the voltage level of the external power supply voltage Vext and the signal level of the input signal IN are simultaneously decreased, the present Embodiment is capable of being applied to the situation that the decrease of the voltage level of the external power supply voltage Vext occurs prior to the decrease of the signal level of the input signal IN. For example, the signal level of the output signal OUTB can be maintained in the low level state even in the situation that the voltage level of the external power supply voltage Vext is decreased less than the logic threshold value TH5 in a timing of the input signal IN of high level, and after that, the signal level of the input signal IN is decreased less than the logic threshold value TH5. Therefore, this change of the signal level of the output signal OUTB is the same as that of the situation that both the voltage level of the external power supply voltage Vext and the signal level of the input signal IN are simultaneously decreased.

Furthermore, in addition to the interface circuits 10, 20, 30 of the foregoing Embodiments 1-3 in which both the voltage level of the external power supply voltage Vext and the signal level of the input signal IN are simultaneously decreased, the present Embodiments are capable of being applied to the situations that the decrease of the voltage level of the external power supply voltage Vext occurs prior to the decrease of the signal level of the input signal IN, or that the decrease of the voltage level of the external power supply voltage Vext occurs subsequent to the decrease of the signal level of the input signal IN (i.e., the signal level of the input signal IN occurs prior to the decrease of the voltage level of the external power supply voltage Vext). For example, when the voltage level of the external power supply voltage Vext and the signal level of the input signal IN are decreased less than the logic threshold values in a timing of the input signal IN of high level, then the signal level of the output signal OUTA is maintained in a high level and the signal level of the output signal OUTB is maintained in a low level state. Similarly, when the voltage level of the external power supply voltage Vext and the signal level of the input signal IN are decreased less than the logic threshold values in a timing of the input signal IN of low level, then the signal level of the output signal OUTA is maintained in a low level and the signal level of the output signal OUTB is maintained in a high level state. Therefore, this change of the signal levels of the output signals OUTA and OUTB is the same as that of the situation that both the voltage level of the external power supply voltage Vext and the signal level of the input signal IN are simultaneously decreased.

In summary, the interface circuit (10) according to the present invention receives the first voltage (Vext) and the second voltage (Vint) and generates an interface output signal based on the input signal (IN). The first semiconductor logic gate (11) which receives the first voltage and outputs the first output signal (S1) of low level when a signal level of the input signal (IN) is not less than the logic threshold value (TH1), alternatively outputs the first output signal (S1) of high level in response to the first voltage (Vext) when a signal level of the input signal is less than the logic threshold value (TH1). The second semiconductor logic gate (12) which receives the second voltage (Vint) and outputs the second output signal (S2) of low level when a signal level of the input signal (IN) is not less than a logic threshold value (TH2), alternatively outputs the second output signal (S2) of high level in response to the second voltage (Vint) when a signal level of the input signal (IN) is less than the logic threshold value (TH2). The third semiconductor logic gate (13) which receives the second voltage (Vint) and outputs a third output signal (S3) of low level when a signal level of the first output signal (S1) is not less than a logic threshold value (TH3), alternatively outputs the third output signal (S3) of high level in response to the second voltage (Vint) when a signal level of the first output signal (S1) is less than the logic threshold value (TH3). The latch circuit (14) which receives the second output signal (S2) and the third output signal (S3) and generates a 4th output signal (OUTA) and a 5th output signal (OUTB) to output the 4th output signal or the 5th output signal as the interface output signal. The latch circuit (14) generates the 4th output signal (S4) having an inversed signal level from the second output signal (S2) and the 5th output signal (S5) having an inversed signal level from the third output signal (S3) in a first state in which one of the second output signal (S2) and the third output signal is a low level (S3). When both the second output signal (S2) and the third output signal (S3) transit to a second state of high level after the first state, the latch circuit generates the 4th output signal (S4) and the 5th output signal (S5) holding the respective signal levels of the first state just before transition to the second state.

Furthermore, the interface circuit (10, 20, or 30) according to the present invention comprises: a semiconductor logic gate (12, 21) configured to receive the input signal (IN) having a signal level changeable between the first voltage (Vext) and the ground potential (Vss) and outputs the logic gate signal (S2, LS) which has a signal level becoming a low level when a signal level of the input signal (IN) is not less than the logic threshold value (TH2, TH4), alternatively has a signal level becoming a high level when a signal level of the input signal (IN) is less than the logic threshold value (TH2, TH4); and a latch circuit (14, 24, or 34) which fetches the logic gate signal as a first latch signal, while fetching a signal (S3) which is converted from the input signal (IN) and has a signal level varying between a second voltage (Vint) and the ground potential (Vss), alternatively, the input signal (IN) as a second latch signal, to output the first interface output signal (OUTA) and the second interface output signal (OUTB). The latch circuit outputs (14, 24, or 34) a signal having an inversed signal level from the signal level of the first latch signal (S2, LS) as the first interface output signal (OUTA) and outputs a signal having an inversed signal level from the signal level of the second latch signal (S3, IN) as the second interface output signal (OUTB) in a first state in which only one of the first latch signal (S2,LS) and second latch signal (S3, IN) is a low level. When both the first latch signal (S2, LS) and the second latch signal (S3, IN) transit from the first state to a second state in which both the first latch signal and the second latch signal are in a high level or in a low level, the latch circuit (14, 24, or 34) outputs at least one of the first interface output signal (OUTA) and the second interface output signal (OUTB) holding the respective signal levels of the first state just before transition from the second state to the second state.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims.

This application is based upon and claims the benefits of priority from the prior Japanese Patent Applications No. 2015-192956 filed on Sep. 30, 2015, and No. 2016-134254 filed on Jul. 6, 2016, the entire contents of which are incorporated herein by reference.

What is claimed is:

1. An interface circuit configured to receive a first voltage and a second voltage and generate an interface output signal based on an input signal, the interface circuit comprising:
    a first semiconductor logic gate which receives said first voltage and outputs a first output signal of low level when a signal level of said input signal is not less than a logic threshold value, alternatively outputs said first output signal of high level in response to said first voltage when a signal level of said input signal is less than said logic threshold value;
    a second semiconductor logic gate which receives said second voltage and outputs a second output signal of low level when a signal level of said input signal is not less than a logic threshold value, alternatively outputs said second output signal of high level in response to said second voltage when a signal level of said input signal is less than said logic threshold value;
    a third semiconductor logic gate which receives said second voltage and outputs a third output signal of low level when a signal level of said first output signal is not less than a logic threshold value, alternatively outputs said third output signal of high level in response to said second voltage when a signal level of said first output signal is less than said logic threshold value; and
    a latch circuit which receives said second output signal and said third output signal and generates a 4th output signal and a 5th output signal to output said 4th output signal or said 5th output signal as said interface output signal, wherein
    said latch circuit generates said 4th output signal having an inversed signal level from said second output signal and said 5th output signal having an inversed signal level from said third output signal in a first state in which one of said second output signal and said third output signal is a low level,
    when, after said first state, both said second output signal and said third output signal transit to a second state of high level, said latch circuit generates said 4th output signal and said 5th output signal holding the respective signal levels of said first state just before transition to said second state.

2. The interface circuit according to claim 1, wherein said input signal has a potential in response to said first voltage in the high level and a ground potential in the low level.

3. The interface circuit according to claim 1, wherein said first semiconductor logic gate outputs said first output signal having a ground potential in the low level,
    said second semiconductor logic gate outputs said second output signal having the ground potential in the low level, and
    said third semiconductor logic gate outputs said third output signal having the ground potential in the low level.

4. The interface circuit according to claim 1, wherein said first voltage is an external power supply voltage supplied from an outside, and
    said second voltage is a voltage voltage-converted from said first voltage by a voltage convert circuit.

5. The interface circuit according to claim 1, wherein said first semiconductor logic gate includes a first transistor of first conductive type and a second transistor of second conductive type opposite to said first conductivity type which are connected to each other at respective drain terminals, and
    said second semiconductor logic gate includes a third transistor of said first conductivity type and a 4th transistor of said second conductivity type which are connected to each other at respective drain terminals, and
    said third semiconductor logic gate a 5th transistor of said first conductivity type and a 6th transistor of said second conductivity type which are connected to each other at respective drain terminals, and said first transistor has a source terminal to which said first voltage is applied, and said second transistor has a source terminal being grounded, and said third transistor has a source terminal to which said second voltage is applied, and said 4th transistor has a source terminal being grounded, and said 5th transistor has a source terminal to which said second voltage is applied, and said 6th transistor has a source terminal being grounded.

6. The interface circuit according to claim 1, wherein said latch circuit includes a first NAND circuit and a second NAND circuit.

7. The interface circuit according to claim 1, wherein a logic threshold value of said first semiconductor logic gate, the logic threshold value of said second semiconductor logic gate and the logic threshold value of said third semiconductor logic gate are equal to one another.

8. An interface circuit configured to receive a first voltage and a second voltage and generate an interface output signal based on an input signal, the interface circuit comprising:

a first semiconductor logic gate which receives said first voltage and outputs a first output signal in response to said input signal;

a second semiconductor logic gate which receives said second voltage and outputs a second output signal in response to said input signal;

a third semiconductor logic gate which receives said second voltage and outputs a third output signal in response to said first output signal; and a latch circuit which receives said second output signal and said third output signal being input and generates said interface output signal, wherein said latch circuit outputs an output value, as said interface output signal, reflecting said second output signal and said third output signal when said second output signal and said third output signal being input have logic values different from each other, when both logic values of said second output signal and said third output signal being input are the same, said latch circuit maintains said output value just before both the logic values become the same and outputs said output value as said interface output signal.

9. An interface circuit configured to receive a first voltage and a second voltage and generate an interface output signal based on an input signal, the interface circuit comprising:

a semiconductor logic gate configured to receive the input signal having a signal level changeable between the first voltage and a ground potential and to output a logic gate signal which has a signal level becoming a low level when a signal level of said input signal is not less than a logic threshold value, and, alternatively has a signal level becoming a high level when a signal level of said input signal is less than said logic threshold value; and a latch circuit which fetches said logic gate signal as a first latch signal, while fetching a signal which is converted from said input signal and has a signal level varying between the second voltage and the ground potential, and which fetches, alternatively, said input signal as a second latch signal, to output the first interface output signal and the second interface output signal, wherein said latch circuit outputs a signal having an inversed signal level from the signal level of said first latch signal as said first interface output signal and outputs a signal having an inversed signal level from the signal level of said second latch signal as said second interface output signal in a first state in which only one of said first latch signal and second latch signal is a low level, and when both said first latch signal and said second latch signal transit from said first state to a second state in which both said first latch signal and said second latch signal are in a high level or in a low level, said latch circuit outputs at least one of said first interface output signal and said second interface output signal holding the respective signal levels of said first state just before transition from said second state to said second state.

10. The interface circuit according to claim 9, wherein said latch circuit fetches said input signal as said second latch signal, said latch circuit generates, in said first state, a signal having an inversed signal level from said logic gate signal as said first interface output signal and a signal having an inversed signal level from said input signal as said second interface output signal.

11. The interface circuit according to claim 10, wherein said latch circuit includes a first NOR circuit and a second NOR circuit.

12. The interface circuit according to claim 10, wherein said first NOR circuit includes a first transistor of first conductive type having a source terminal to which said second voltage is applied, a second transistor of second conductive type opposite to said first conductivity type having a source terminal being grounded and a gate terminal receiving said input signal, a third transistor of said first conductivity type having a source terminal connected to a drain terminal of said first transistor, and a 4th transistor of said second conductivity type having a source terminal being grounded, a drain terminal connected to a drain terminal of said third transistor, and a gate terminal receiving said second interface output signal, wherein said second NOR circuit includes a 5th transistor of said first conductivity type having a source terminal to which said second voltage is applied, a 6th transistor of said second conductivity type having a source terminal being grounded and a gate terminal receiving said logic gate signal, a 7th transistor of said first conductivity type having a source terminal to which the drain terminal of said 5th transistor is connected, and an 8th transistor of said second conductivity type having a source terminal being grounded and a drain terminal to which the drain terminal of said 7th transistor is connected and a gate terminal receiving said second interface output signal.

13. The interface circuit according to claim 12, wherein said first transistor, said second transistor, said 5th transistor and said 6th transistor are high breakdown voltage transistors;

said third transistor, said 4th transistor, said 7th transistor and said 8th transistor are low breakdown voltage transistors;

said first transistor receives said input signal at the gate terminal;

said third transistor receives said interface output signal at the gate terminal;

said 5th transistor receives said logic gate signal at the gate terminal; and said 7th transistor receives said second interface output signal at the gate terminal.

14. The interface circuit according to claim 12, wherein
said first transistor, said 4th transistor, said 5th transistor and said 8th transistor are low breakdown voltage transistors;
said second transistor, said third transistor, said 6th transistor and said 7th transistor are high breakdown voltage transistors;
said first transistor receives said interface output signal at the gate terminal;
said third transistor receives said input signal at the gate terminal;
said 5th transistor receives said second interface output signal at the gate terminal; and
said 7th transistor receives said logic gate signal.

15. An interface circuit configured to receive a first voltage and a second voltage and generate an interface output signal based on an input signal, the interface circuit comprising:

a latch circuit to which the input signal and said first voltage are supplied, the input signal having a signal level changeable between the first voltage and a ground potential, to output the output signal, wherein said latch circuit outputs said output signal as a signal having a signal level varying with an opposite phase to said input signal in a first state in which the voltage level of said first voltage is higher than the logic threshold value, and when the voltage level of said first voltage transit from said first state to a second state in which the voltage level of said first voltage is less than said logic threshold value, said latch circuit outputs holding the signal level in said first state just before transition to said second state.

16. The interface circuit according to claim 15, wherein said latch circuit includes a first NOR circuit and a second NOR circuit.

* * * * *